(12) United States Patent
Yun et al.

(10) Patent No.: US 10,431,593 B2
(45) Date of Patent: Oct. 1, 2019

(54) THREE-DIMENSIONAL SEMICONDUCTOR MEMORY DEVICES

(71) Applicant: Samsung Electronics Co., Ltd., Suwon-si, Gyeonggi-do (KR)

(72) Inventors: Jang-Gn Yun, Hwaseong-si (KR); Sung-Min Hwang, Hwaseong-si (KR); Joon-Sung Lim, Yongin-si (KR); Kyoil Koo, Hwaseong-si (KR); Hoosung Cho, Yongin-si (KR); Sunyoung Kim, Seongnam-si (KR); Cheol Ryou, Hwaseong-si (KR); Jaesun Yun, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/860,082

(22) Filed: Jan. 2, 2018

(65) Prior Publication Data
US 2018/0374867 A1    Dec. 27, 2018

(30) Foreign Application Priority Data
Jun. 27, 2017   (KR) .................. 10-2017-0080913

(51) Int. Cl.
*H01L 27/11582* (2017.01)
*H01L 29/10* (2006.01)
(Continued)

(52) U.S. Cl.
CPC .... *H01L 27/11582* (2013.01); *H01L 27/1157* (2013.01); *H01L 27/11565* (2013.01); *H01L 29/1037* (2013.01); *H01L 29/4234* (2013.01)

(58) Field of Classification Search
CPC ......... H01L 29/11582; H01L 29/11565; H01L 29/11578; H01L 27/115; H01L 27/11504; H01L 27/11507; H01L 27/11509; H01L 27/11512; H01L 27/11514; H01L 27/11519; H01L 27/11521; H01L 27/11526; H01L 27/11548; H01L 27/11551; H01L 27/11556; H01L 27/11565; H01L 27/11578; H01L 27/11582; H01L 27/11587; H01L 27/1159;
(Continued)

(56) References Cited

U.S. PATENT DOCUMENTS 6,723,612 B2    4/2004   Iijima et al.
7,982,261 B2    7/2011   Kidoh et al.
(Continued)

*Primary Examiner* — Victoria K. Hall
(74) *Attorney, Agent, or Firm* — Harness, Dickey & Pierce, P.L.C.

(57) ABSTRACT

Disclosed is a three-dimensional semiconductor memory device that includes first to third channel groups arranged in a first direction on a substrate. The first to third channel groups are spaced apart from each other along a second direction on the substrate. Each of the first to third channel groups includes a plurality of vertical channels that extend in a third direction perpendicular to a top surface of the substrate. The first and second channel groups are adjacent to each other in the second direction and spaced apart at a first distance in the second direction. The second and third channel groups are adjacent to each other in the second direction and are spaced apart at a second distance that is less than the first distance.

19 Claims, 36 Drawing Sheets

(51) Int. Cl.
    *H01L 29/423*        (2006.01)
    *H01L 27/11565*      (2017.01)
    *H01L 27/1157*       (2017.01)

(58) Field of Classification Search
    CPC ......... H01L 27/11592; H01L 27/11595; H01L 27/11597
    See application file for complete search history.

(56) References Cited

U.S. PATENT DOCUMENTS

| | | |
|---|---|---|
| 8,013,389 B2 | 9/2011 | Oh et al. |
| 8,174,890 B2 | 5/2012 | Maeda et al. |
| 8,765,538 B2 | 7/2014 | Kim et al. |
| 8,809,938 B2 | 8/2014 | Hwang et al. |
| 8,884,357 B2 | 11/2014 | Wang et al. |
| 2010/0109072 A1 | 5/2010 | Kidoh et al. |
| 2012/0003800 A1* | 1/2012 | Lee ................... H01L 27/11551 438/261 |
| 2013/0161831 A1* | 6/2013 | Hwang ............. H01L 27/11551 257/775 |
| 2014/0016408 A1 | 1/2014 | Lee et al. |
| 2015/0145014 A1* | 5/2015 | Shin ................... H01L 27/11563 257/314 |
| 2016/0005760 A1 | 1/2016 | Lee et al. |
| 2016/0071865 A1 | 3/2016 | Yanai et al. |
| 2016/0071875 A1 | 3/2016 | Shimojo et al. |
| 2016/0343434 A1 | 11/2016 | Lee et al. |
| 2016/0343703 A1 | 11/2016 | Go et al. |
| 2018/0130818 A1* | 5/2018 | Kim .................... H01L 23/5226 |

* cited by examiner

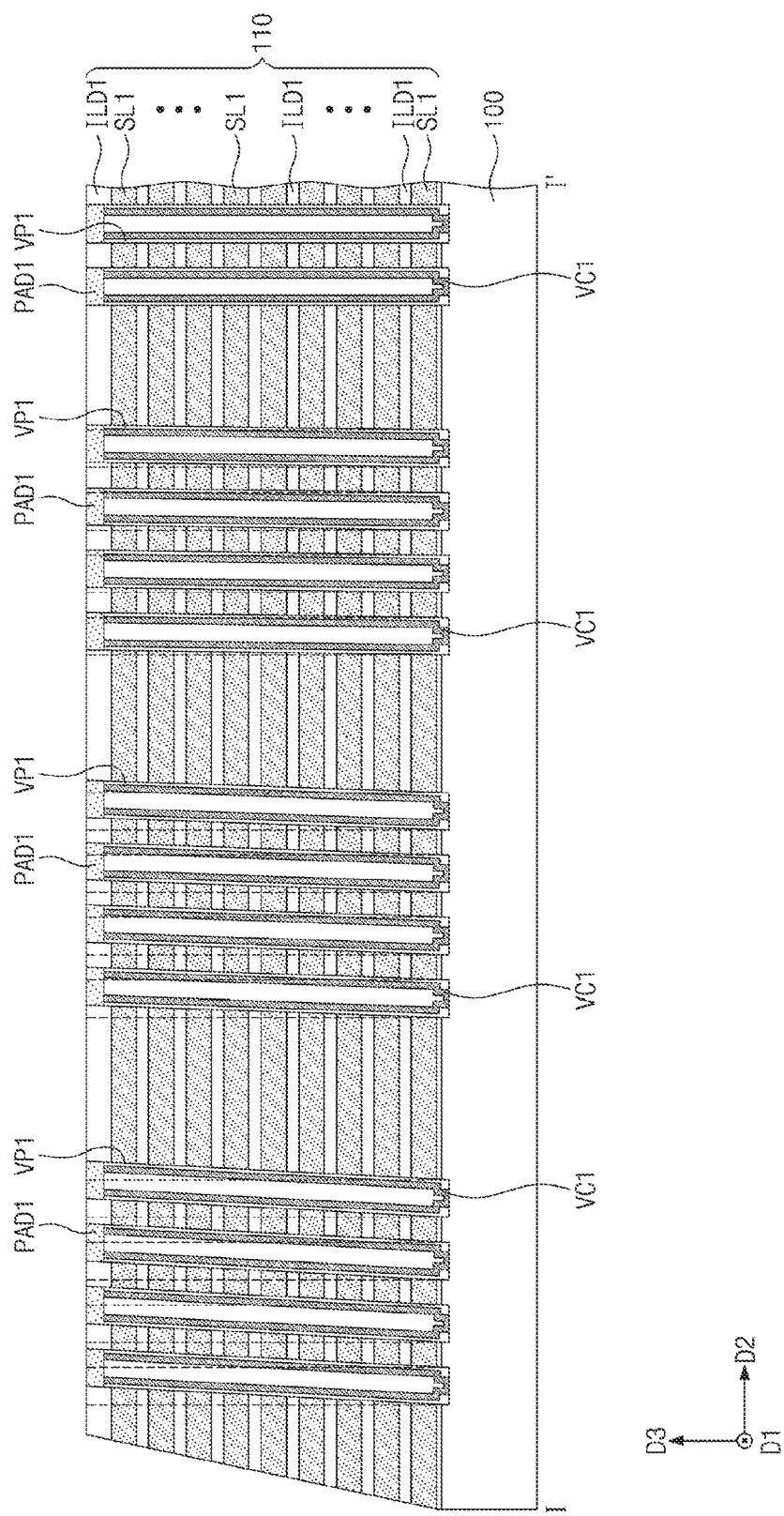

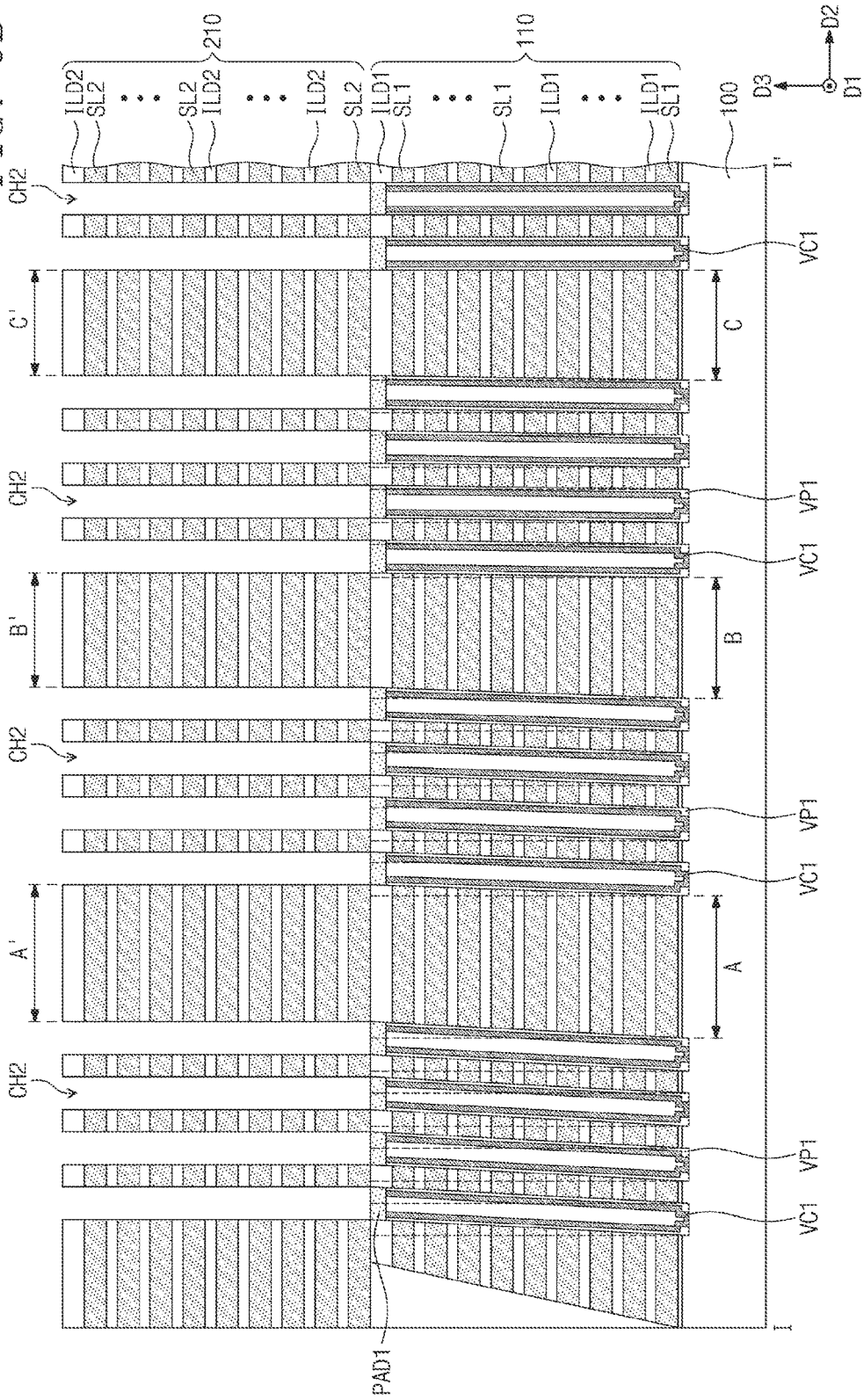

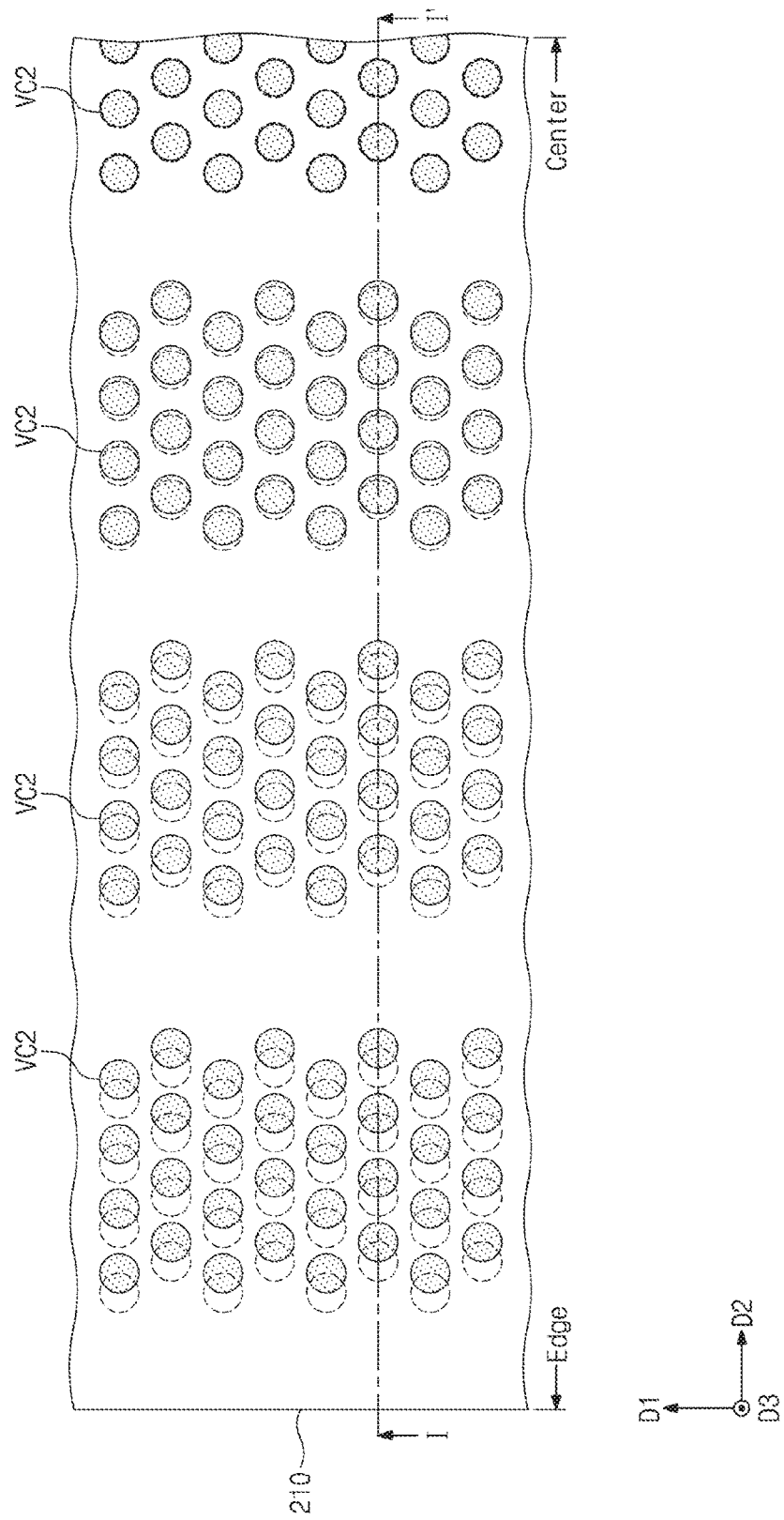

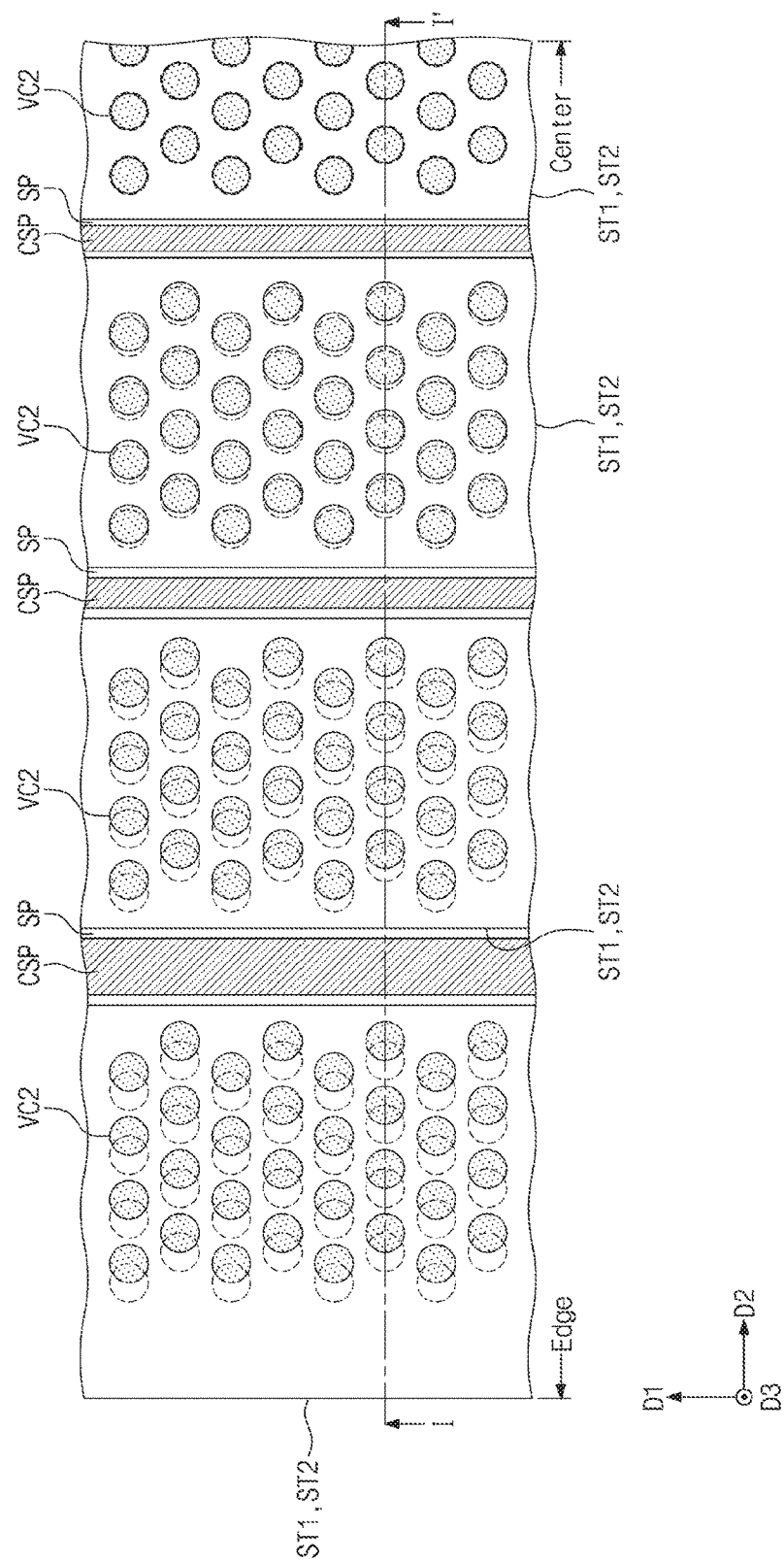

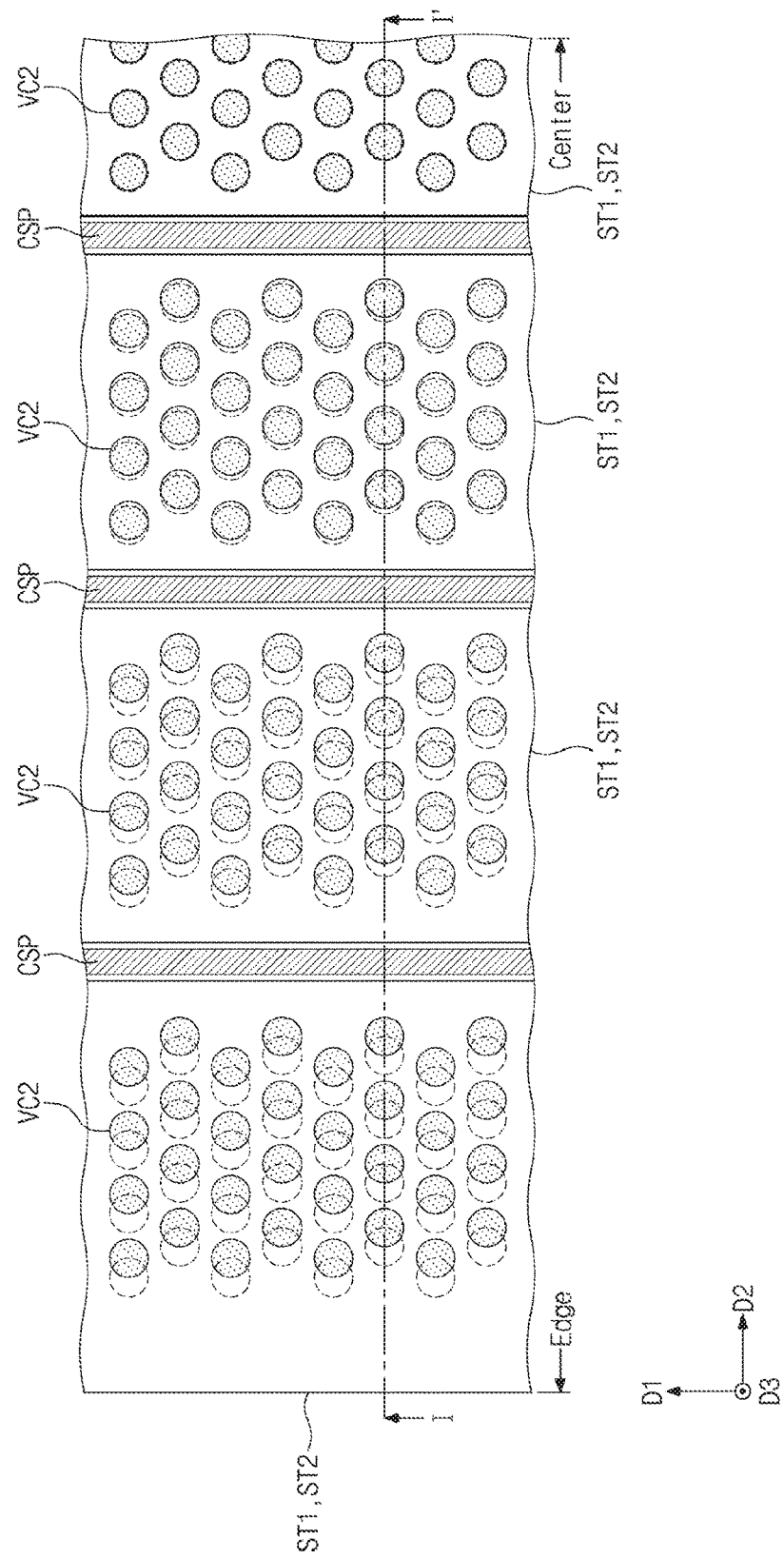

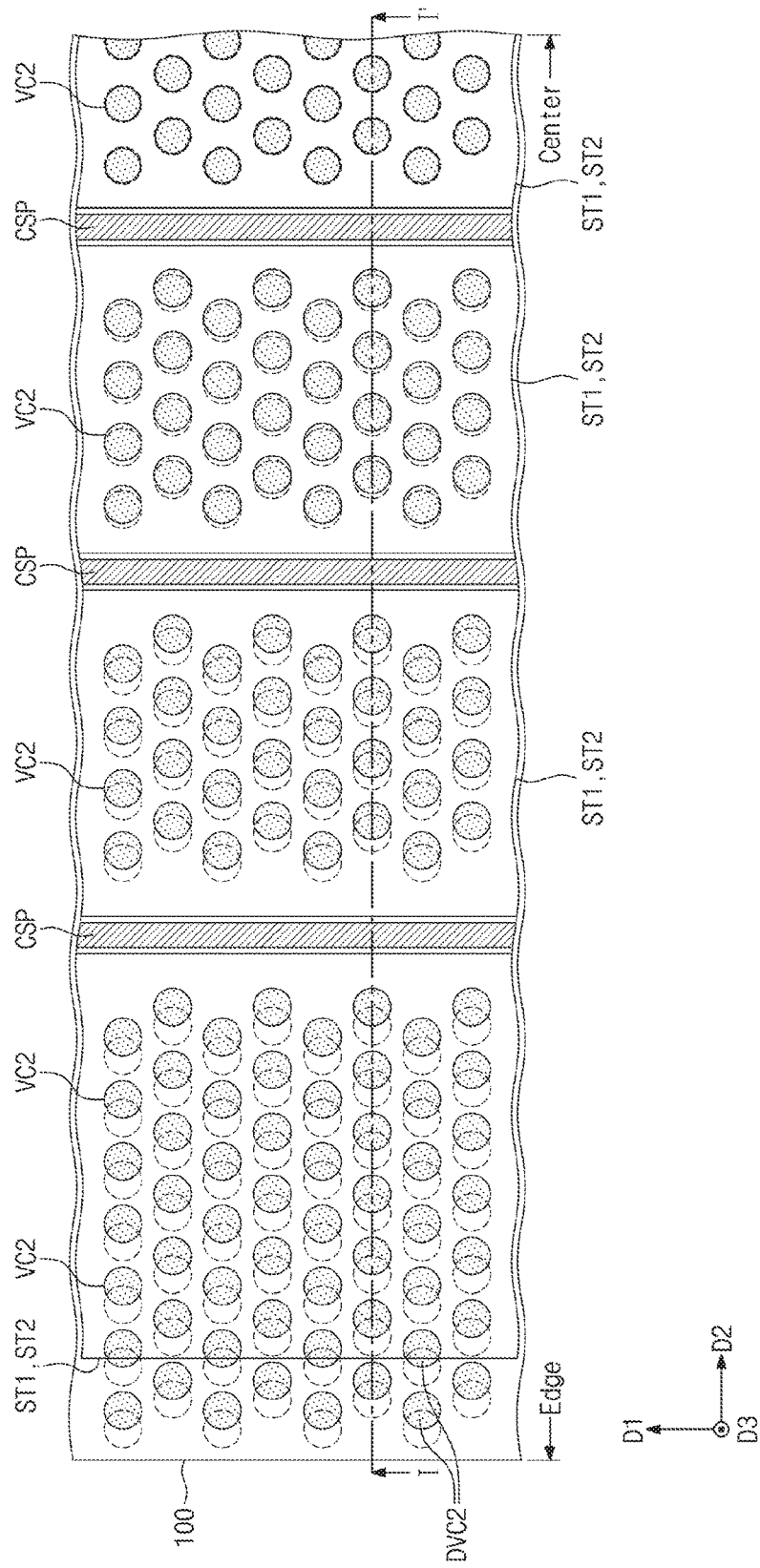

THREE-DIMENSIONAL SEMICONDUCTOR MEMORY DEVICES

CROSS-REFERENCE TO RELATED APPLICATIONS

This U.S. nonprovisional patent application claims priority under 35 U.S.C § 119 to Korean Patent Application No. 10-2017-0080913 filed on Jun. 27, 2017, the disclosure of which is hereby incorporated herein by reference in its entirety.

BACKGROUND

The disclosure relates to three-dimensional semiconductor memory devices, and more particularly, to three-dimensional semiconductor memory devices having enhanced integration.

Attempts are being made to increase the integration of semiconductor devices. As the integration of the semiconductor devices is an important factor in determining product price, high integration is increasingly demanded in particular. The integration of a two-dimensional or planar semiconductor device is primarily based on the area occupied by its unit memory cell, and consequently the size of fine patterns is a factor. However, extremely expensive processing equipment is needed to produce fine patterns, which sets a practical limitation on increasing the integration of two-dimensional or planar semiconductor device. Therefore, there have been proposed three-dimensional semiconductor memory devices having three-dimensionally arranged memory cells.

SUMMARY

Some example embodiments of inventive concepts provide three-dimensional semiconductor memory devices having enhanced integration.

Features and/or effects of inventive concepts are not limited to the above-mentioned ones, other features and/or effects which have not been mentioned above will be clearly understood to those skilled in the art from the following description.

According to some example embodiments of inventive concepts, a three-dimensional semiconductor memory device may include a substrate; a first channel group, a second channel group, and a third channel group that each are arranged in a first direction on the substrate. The first channel group to the third channel group may be spaced apart from each other along a second direction on the substrate. The second direction may cross the first direction. Each of the first channel group, the second channel group, and the third channel group may include a plurality of vertical channels that extend in a third direction perpendicular to a top surface of the substrate. The first channel group and the second channel groups may be adjacent to each other in the second direction and may be spaced apart by a first distance in the second direction. The second channel group and the third channel group may be adjacent to each other in the second direction and may be spaced apart at a second distance less than the first distance.

According to some example embodiments of inventive concepts, a three-dimensional semiconductor memory device may include a substrate, a lower electrode on the substrate, a plurality of lower vertical channels that penetrate the lower electrode structure, an upper electrode structure on the lower electrode structure, and a plurality of upper vertical channels that penetrate the upper electrode structure and are connected to the plurality of lower vertical channels. The lower electrode structure may include a plurality of lower electrodes that are vertically stacked on the substrate. The upper electrode structure may include a plurality of upper electrodes that are vertically stacked on the lower electrode structure. A first distance between upper portions of the plurality of lower vertical channels that neighbor each other may be different from a second distance between upper portions of the plurality of upper vertical channels that neighbor each other.

According to some example embodiments of inventive concepts, a three-dimensional semiconductor memory device may include a substrate, a first lower channel group and a second lower channel group on the substrate, and a first upper channel group and a second upper channel group on the substrate at a height above a height of the first lower channel group and a height of the second lower channel group. The first lower channel group and the second lower channel group may each include a plurality of lower vertical channels on the substrate. The first lower channel group and the second lower channel group may be spaced apart at a first distance. The first upper channel group and the second upper channel groups may be spaced apart at a second distance that is less than the first distance.

BRIEF DESCRIPTION OF THE DRAWINGS

FIGS. 7A to 14A are plan views that illustrate a method of fabricating a three-dimensional semiconductor memory device according to some example embodiments of inventive concepts.

FIGS. 7B to 14B are cross-sectional views taken along line I-I' of FIGS. 7A to 14A, respectively, illustrating a method of fabricating a three-dimensional semiconductor memory device according to some example embodiments of inventive concepts.

DETAILED DESCRIPTION

It will be hereinafter discussed in detail three-dimensional semiconductor memory devices and methods of fabricating the same according to some example embodiments of inventive concepts in conjunction with the accompanying drawings.

Figure 1:
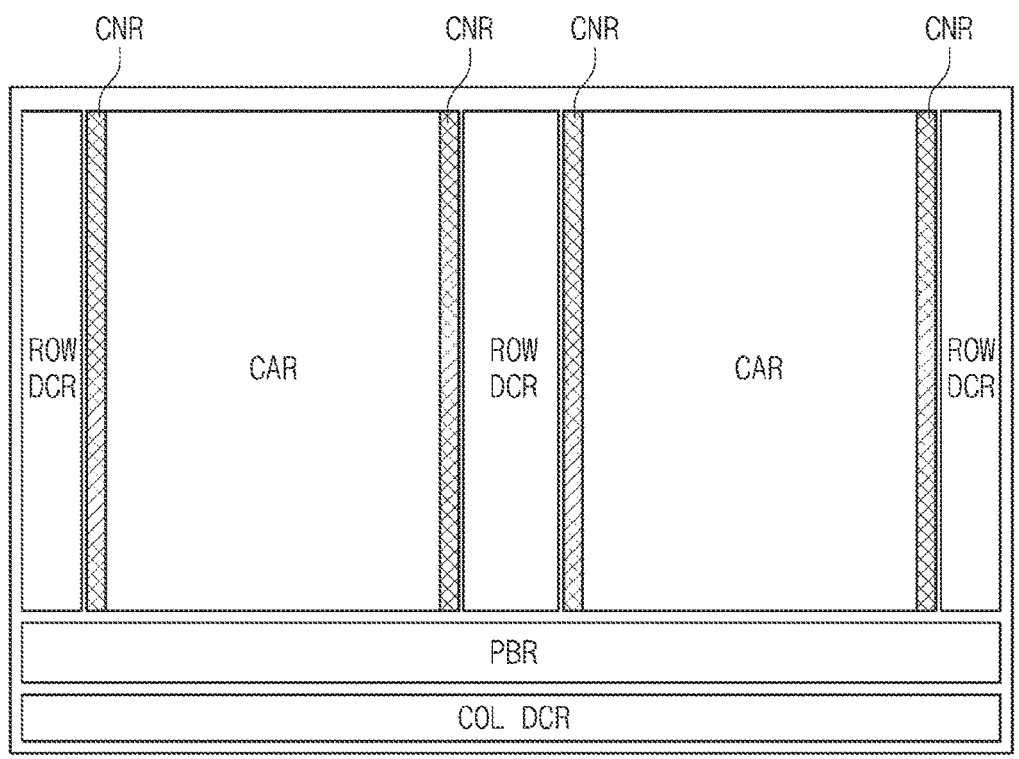
FIG. 1 is a schematic diagram that illustrates a simplified configuration of a three-dimensional semiconductor memory device according to some example embodiments of inventive concepts.

FIG. 1 is a schematic diagram that illustrates a simplified configuration of a three-dimensional semiconductor memory device according to some example embodiments of inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, connection regions CNR may be disposed between the cell array region CAR and the row decoder regions ROW DCR.

The cell array region CAR may include a memory cell array including a plurality of memory cells. In some embodiments, the memory cell array may include three-dimensionally arranged memory cells and a plurality of word lines and bit lines electrically connected to the memory cells.

The row decoder region ROW DCR may include a row decoder that selects the word lines of the memory cell array, and the connection region CNR may include a line structure including contact plugs and connect lines that electrically connect the memory cell array to the row decoder. For example, the line structure may be electrically connected to the word lines. The row decoder may select one of the word lines of the memory cell array in accordance with address information. The row decoder may provide word line voltages to the selected word line and unselected word lines in response to a control signal from a control circuit.

The page buffer region PBR may be provided with a page buffer that reads data stored in the memory cells. Depending on an operating mode, the page buffer may temporarily store data to be stored in the memory cells or sense data stored in the memory cells. The page buffer may function as a write driver circuit in a program operating mode and as a sense amplifier circuit in a read operating mode.

The column decoder region COL DCR may include a column decoder connected to bit lines of the memory cell array. The column decoder may provide a data transmission path between the page buffer and an external device (e.g., a memory controller).

Figure 2:
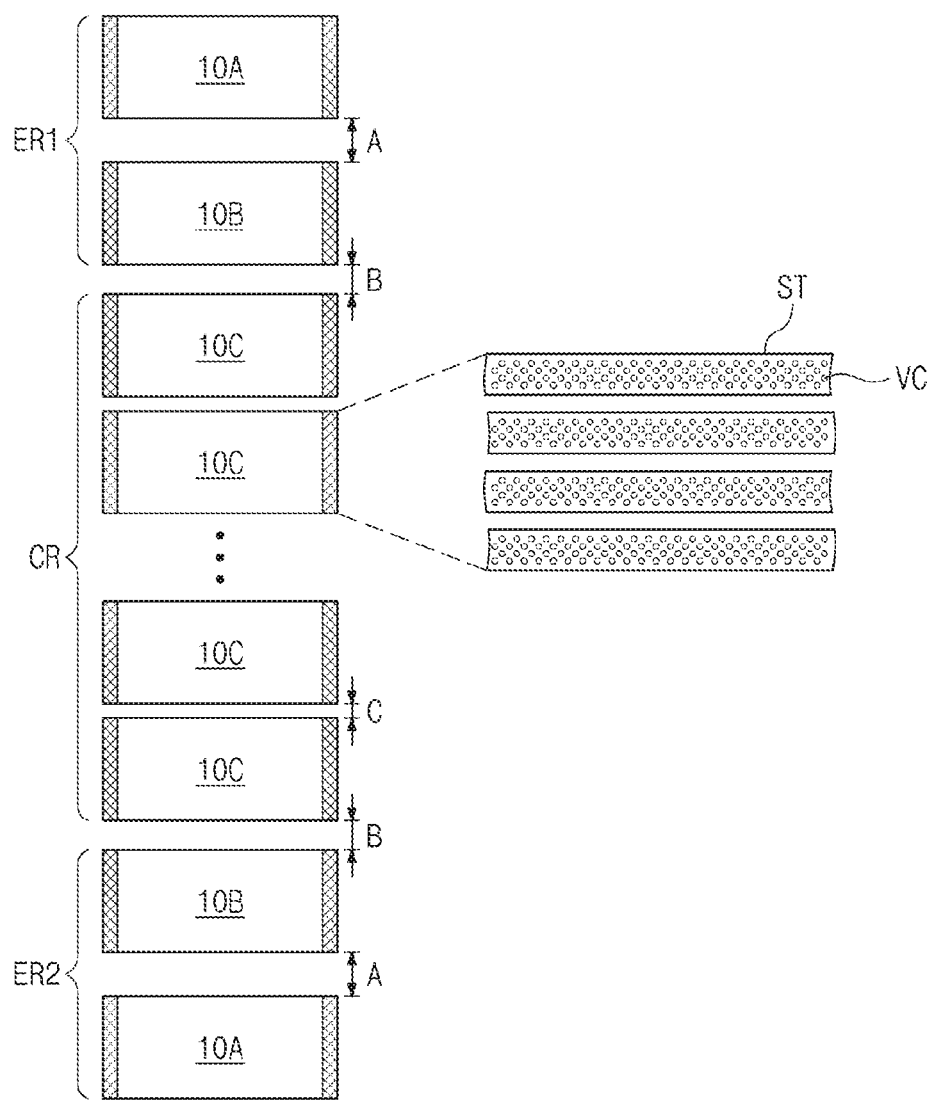
FIG. 2 is a simplified schematic diagram that illustrates a cell array of a three-dimensional semiconductor memory device according to some example embodiments of inventive concepts.

FIG. 2 is a simplified schematic diagram that illustrates a cell array of a three-dimensional semiconductor memory device according to some example embodiments of inventive concepts.

Referring to FIG. 2, a three-dimensional semiconductor memory device may include a cell array region CAR of FIG. 1, and the cell array region CAR of FIG. 1 may include an edge region ER1, a second edge region ER2, and a central region CR between the first and second edge regions ER1 and ER2.

The cell array region CAR of FIG. 1 may include a plurality of cell array blocks 10A, 10B, and 10C. Each of the cell array blocks 10A, 10B, and 10C may include three-dimensionally arranged memory cells on a substrate and a plurality of word lines and bit lines electrically connected to the memory cells.

For example, each of the cell array blocks 10A, 10B, and 10C may include a plurality of electrode structures ST and a plurality of vertical channels VC that penetrates each of the plurality of electrode structures ST. The electrode structures ST and the vertical channels VC may constitute three-dimensionally arranged memory cells. In some embodiments, the electrode structures ST may extend in a first direction D1 and be spaced apart from each other in a second direction D2 crossing the first direction D1. Each of the electrode structures ST may include electrodes that are stacked in a third direction D3 perpendicular to the first and second directions D1 and D2, and the vertical channels VC may extend in the third direction D3. The cell array blocks 10A, 10B, and 10C may each further include connection regions CNR of FIG. 1 that are coupled to its opposite sides in the first direction D1.

In some embodiments, the plurality of cell array blocks 10A, 10B, and 10C may be spaced apart from each other in the second direction D2. A distance between adjacent ones of the cell array blocks 10A, 10B, and 10C may increase as approaching the first and second edge regions ER1 and ER2 from the central region CR along the second direction D2. For example, the plurality of cell array blocks 10A, 10B, and 10C may include first and second cell array blocks 10A and 10B provided on each of the first and second edge regions ER1 and ER2 and a plurality of third cell array blocks 10C provided on the central region CR. The second cell array block 10B may be spaced apart from the first cell array block 10A at a first distance A and from the third cell array block 10C at a second distance B less than the first distance A. On the central region CR, the third cell array blocks 10C may be spaced apart from each other at a third distance C less than the second distance B.

Although FIG. 2 shows that a distance between adjacent ones of the cell array blocks 10A, 10B, and 10C increases as approaching the first and second edge regions ER1 and ER2 from the central region CR, inventive concepts are not limited thereto. For example, on each of the cell array blocks 10A, 10B, and 10C, the vertical channels VC may be spaced apart from each other at a distance, which is in one or more of the first and second direction D1 and D2, that increases as approaching an edge region from a central region in each of the cell array blocks 10A, 10B, and 10C.

Figure 3A:
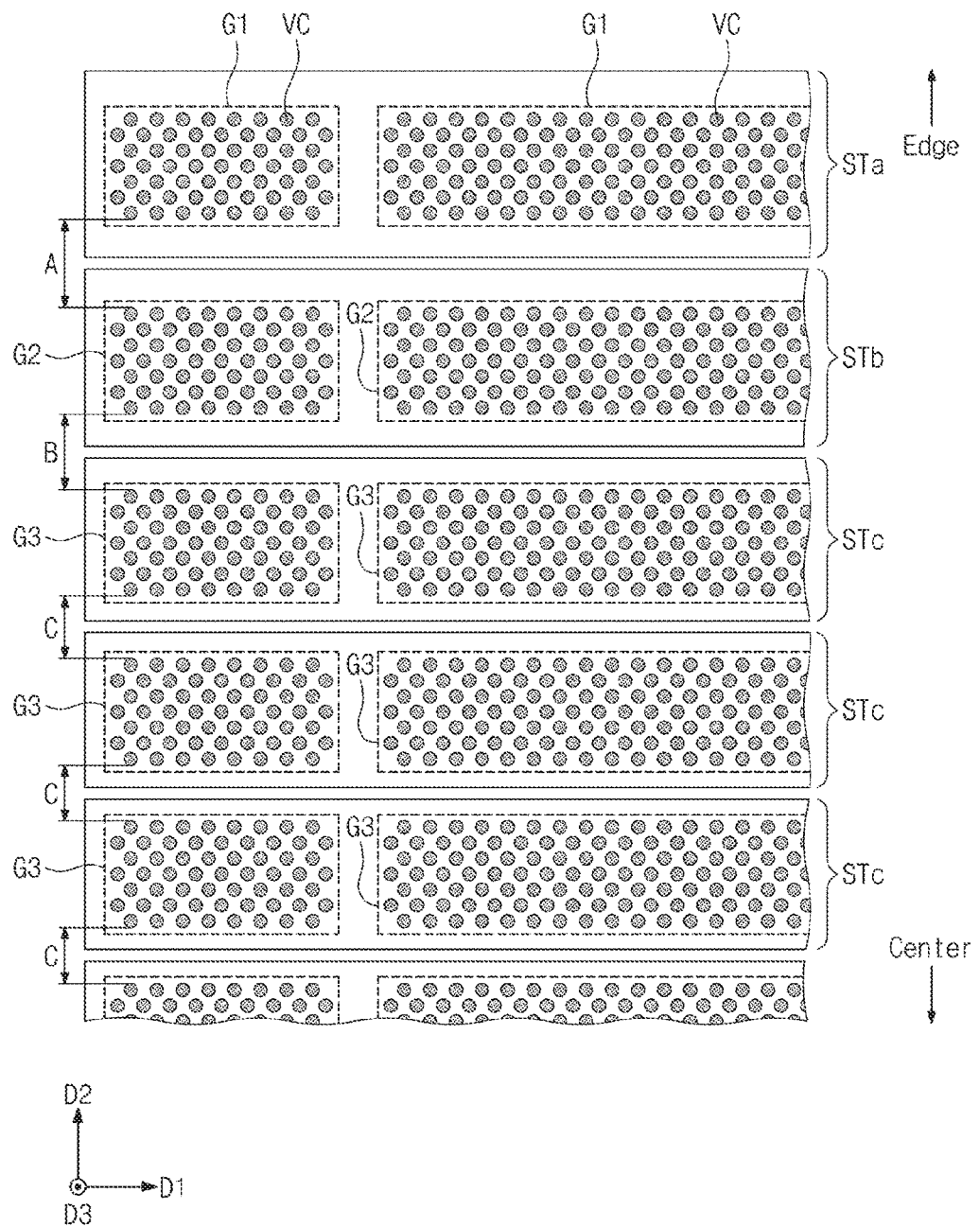
FIGS. 3A and 4A are simplified plan views that illustrate a portion of a three-dimensional semiconductor memory device according to some example embodiments of inventive concepts.
Figure 3B:
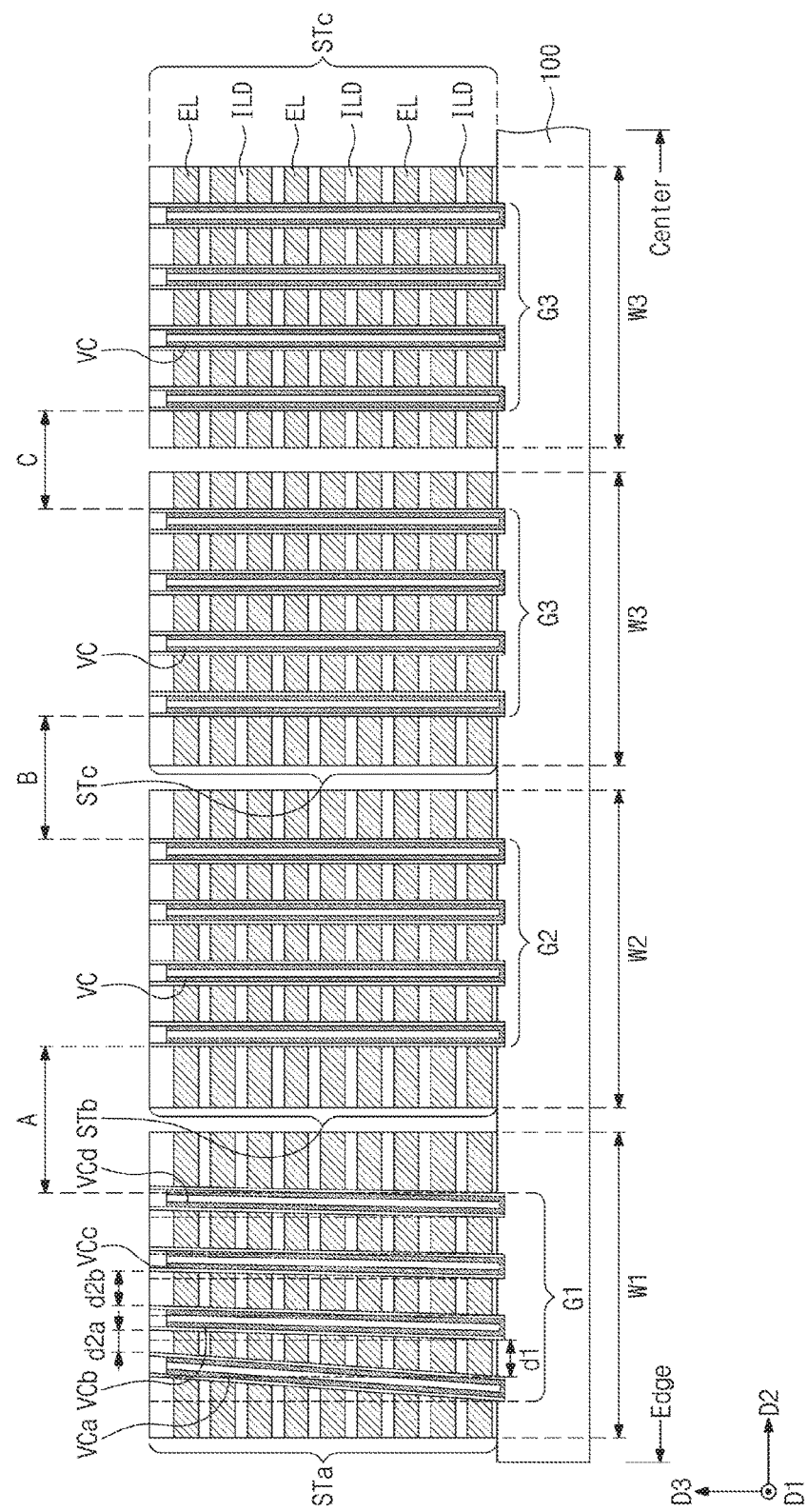
FIGS. 3B and 4B are simplified cross-sectional views that illustrate a portion of a three-dimensional semiconductor memory device according to some example embodiments of inventive concepts.
Figure 4A:
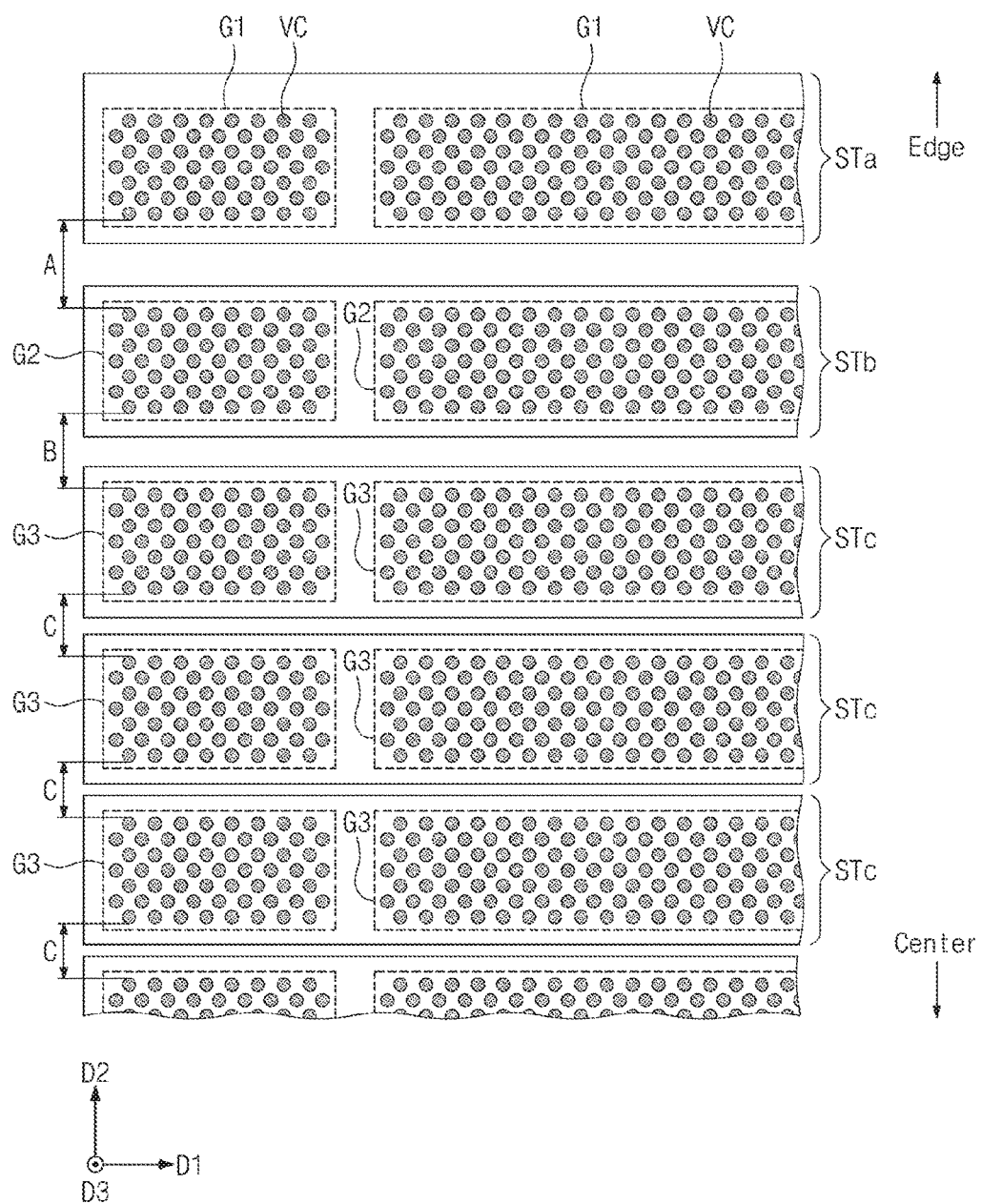
Figure 4B:
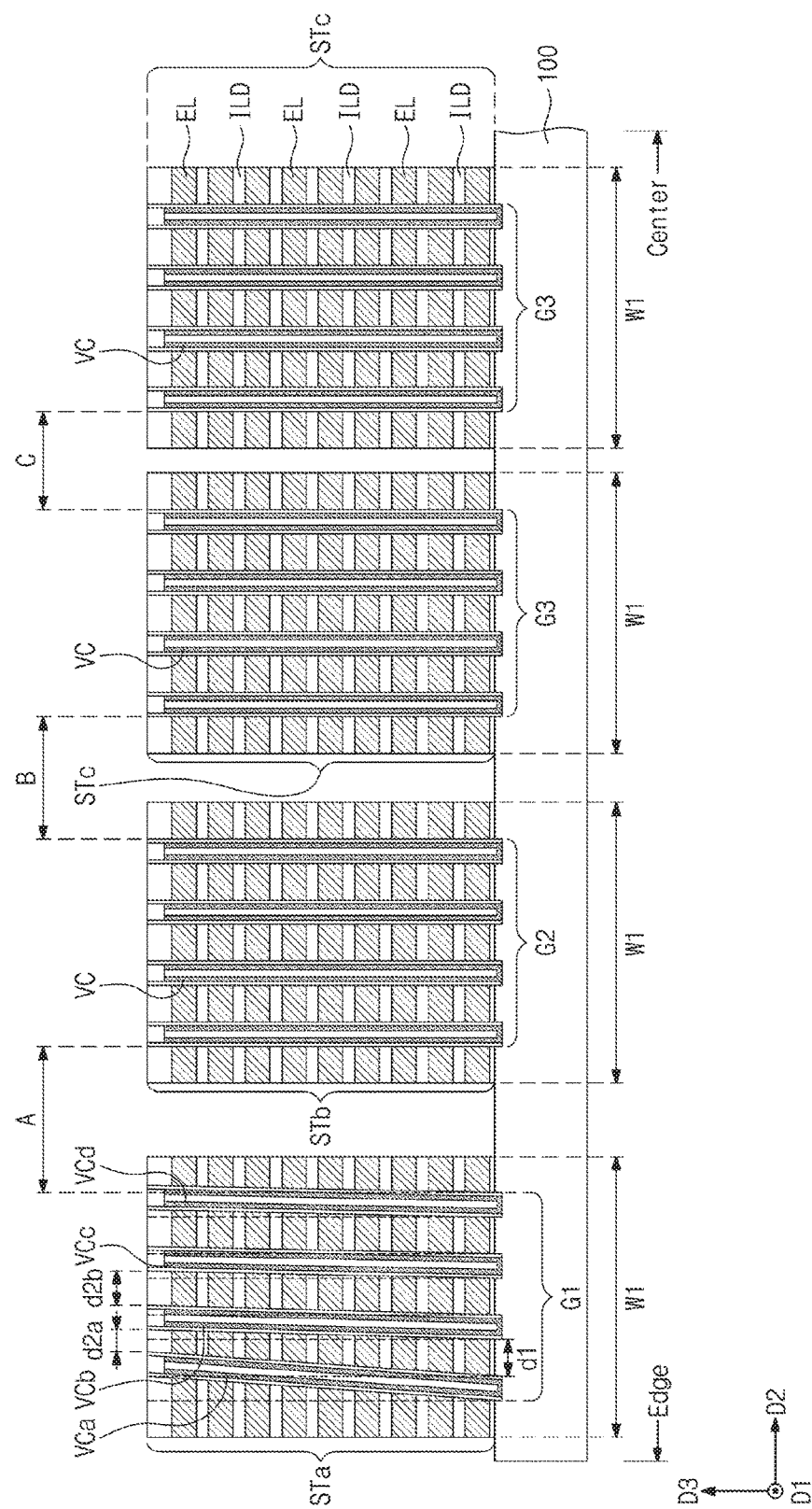

FIGS. 3A and 4A are simplified plan views that illustrate a portion of a three-dimensional semiconductor memory device according to some example embodiments of inventive concepts. FIGS. 3B and 4B are simplified cross-sectional views that illustrate a portion of a three-dimensional semiconductor memory device according to some example embodiments of inventive concepts.

Referring to FIGS. 3A and 3B, a substrate 100 may be provided thereon with first to third channel groups G1, G2, and G3 that are spaced apart from each other in a second direction D2. The same ones of the first to third channel groups G1 to G3 may be arranged in a row along a first direction D1. The first channel groups G1 may be adjacently spaced apart from each other in the first direction D1.

For example, a cell array region (see CAR of FIG. 1) may be provided on its edge portion (designated by symbol Edge of FIGS. 3A and 3B) with the first to third channel groups G1 to G3 sequentially arranged along the second direction D2, and also be provided on its central portion (designated by symbol Center of FIGS. 3A and 3B) with a plurality of the third channel groups G3 spaced apart from each other along the second direction D2.

Each of the first to third channel groups G1 to G3 may include a plurality of vertical channels VC arranged along the first and second directions D1 and D2. The vertical channels VC may extend in a third direction D3 perpendicular to a top surface of the substrate 100, and may penetrate electrodes EL and insulating layers ILD alternately stacked on the substrate 100 along the third direction D3. The vertical channels VC may include a semiconductor material. In some embodiments, each of the first to third channel groups G1 to G3 may have the same number of the vertical channels VC and substantially the same arrangement of the vertical channels VC.

In some embodiments, the first to third channel groups G1 to G3 may be spaced apart from each other at different distances in the second direction D2. The distance between adjacent ones of the first to third channel groups G1 to G3 may increase as approaching the edge portion of the cell array region from the central portion of the cell array region.

For example, the first and second channel groups G1 and G2 adjacent to each other may be spaced apart in the second direction D2 at a first distance A. The second and third channel groups G2 and G3 adjacent to each other may be spaced apart in the second direction D2 at a second distance B less than the first distance A. The third channel groups G3 adjacent to each other may be spaced apart in the second direction D2 at a third distance C less than the second distance B.

The first to third channel groups G1 to G3 may be respectively included in first to third electrode structures STa, STb, and STc provided on the substrate 100. For example, the substrate 100 may be provided thereon with a first electrode structure STa, a second electrode structure STb, and a plurality of third electrode structures STc. Each of the first to third electrode structures STa to STc may extend in the first direction D1, and may include the electrodes EL and the insulating layers ILD alternately and vertically stacked on the substrate 100. The first to third electrode structures STa to STc may be spaced apart from each other in the second direction D2.

According to some embodiments, as illustrated in FIGS. 3A and 3B, the first to third electrode structures STa to STc may be spaced apart from each other at substantially the same distance. The first to third electrode structures STa to STc may have widths W1, W2, and W3, respectively, different from each other in the second direction D2. For example, the first electrode structure STa may have a first width W1, the second electrode structure STb may have a second width W2 less than the first width W1, and the third electrode structure STc may have a third width W3 less than the second width W2.

In some embodiments, the first electrode structure STa may be farthest away from the central portion of the cell array region. The first channel group G1 in the first electrode structure STa may include first, second, third, and fourth vertical channels VCa, VCb, VCc, and VCd sequentially arranged along the second direction D2. The first to fourth channels VCa to VCd in the first electrode structure STa may have a stress-induced inclined structure relative to the top surface of the substrate 100. The first to fourth vertical channels VCa to VCd may be obliquely inclined in a direction toward the central portion of the cell array region. As such, the first to fourth vertical channels VCa to VCd may have a smaller spacing between their top portions than between their bottom portions. For example, the first vertical channel VCa and one sidewall of the first electrode structure STa may be spaced apart at a distance that increases as approaching the top portion of the first vertical channel VCa from the bottom portion of the first vertical channel VCa.

For example, the bottom portions of the first to fourth vertical channels VCa to VCd may be spaced apart from each other at a first bottom distance d1, the top portions of the first and second vertical channels VCa and VCb may be spaced apart from each other at a first top distance d2a, and the top portions of the second and third vertical channels VCb and VCc may be spaced apart from each other at a second top distance d2b greater than the first top distance d2a. The first and second top distances d2a and d2b may be less than the first bottom distance d1.

In some embodiments, neighboring top portions of the vertical channels VC may decrease as the neighboring top portions of the vertical channels approach the central portion of the cell array region from the edge portion of the cell array region. In some embodiments, the first electrode structure STa may be disposed on the edge portion of the cell array region or on each edge portion of the cell array blocks (see 10A, 10B, and 10C of FIG. 2). For example, a distance between adjacent ones of the first to third channel groups G1 to G3 may increase as the first to third channel groups G1 to G3 approach the edge portion of the cell array region or the edge portion of each cell array block.

In some embodiments, because the distance A between the first and second channel groups G1 and G2 is greater than the distance C between the third group channels G3, even if the vertical channels VC of the first channel group G1 become curved or inclined, a spacing may be securely provided between the first and second channel groups G1 and G2.

According to some embodiments, as illustrated in FIGS. 4A and 4B, the first to third electrode structures STa to STc may have substantially the same width W1 in the second direction D2, and may be spaced apart at different spacings from each other. For example, the first and second electrode structures STa and STb may be spaced apart from each other at a first horizontal distance, and the second electrode structure STb and its adjacent third electrode structure STc may be spaced apart from each other at a second horizontal distance less than the first horizontal distance. The third electrode structures STc may be spaced apart from each other at a third horizontal distance less than the second horizontal distance.

The distances A, B, and C between the first to third channel groups G1 to G3 may increase, likewise the embodiment illustrated in FIGS. 3A and 3B, as approaching the edge portion of the cell array region from the central portion of the cell array region. An arrangement of the first to third channel groups G1 to G3 may be the same as that discussed with reference to FIGS. 3A and 3B, and thus the repetitive description will be omitted for brevity.

Figure 5:
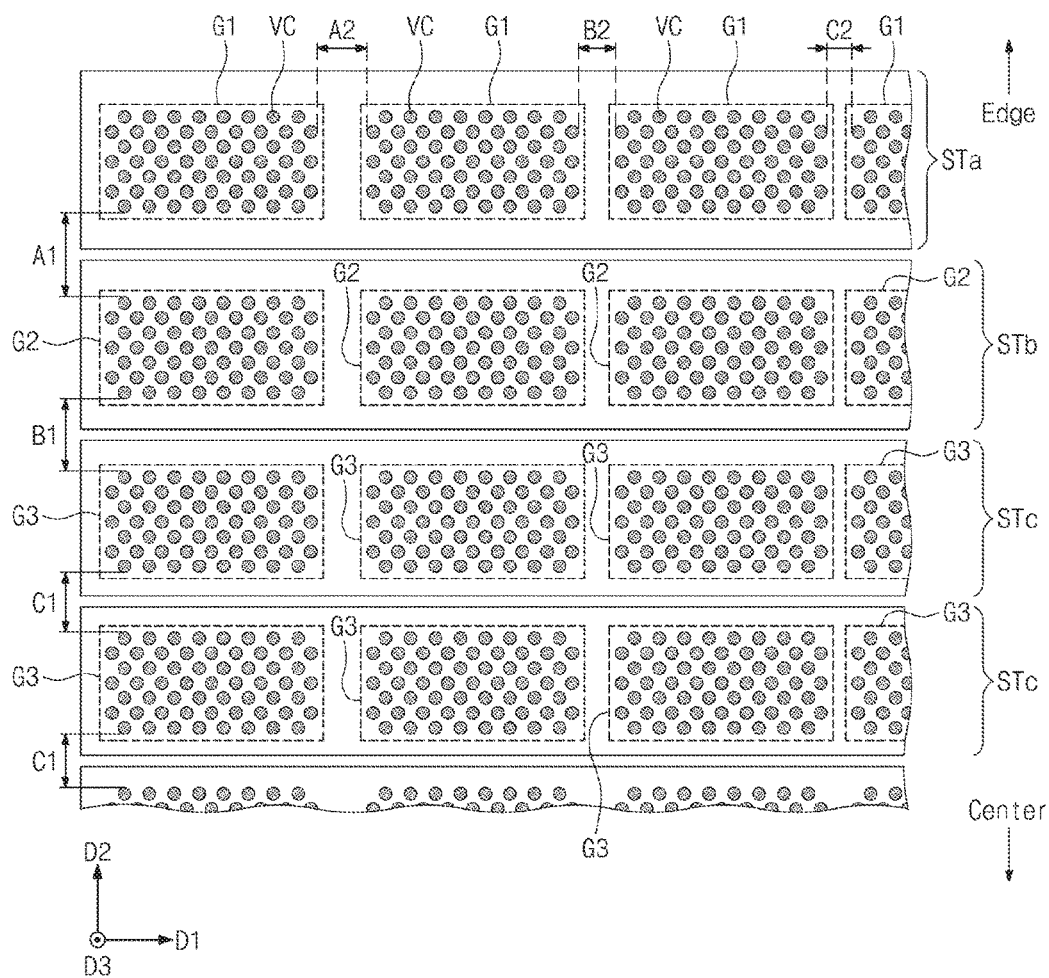
FIGS. 5 and 6 are simplified plan views that illustrate a first edge region of a three-dimensional semiconductor memory device according to some example embodiments of inventive concepts.
Figure 6:
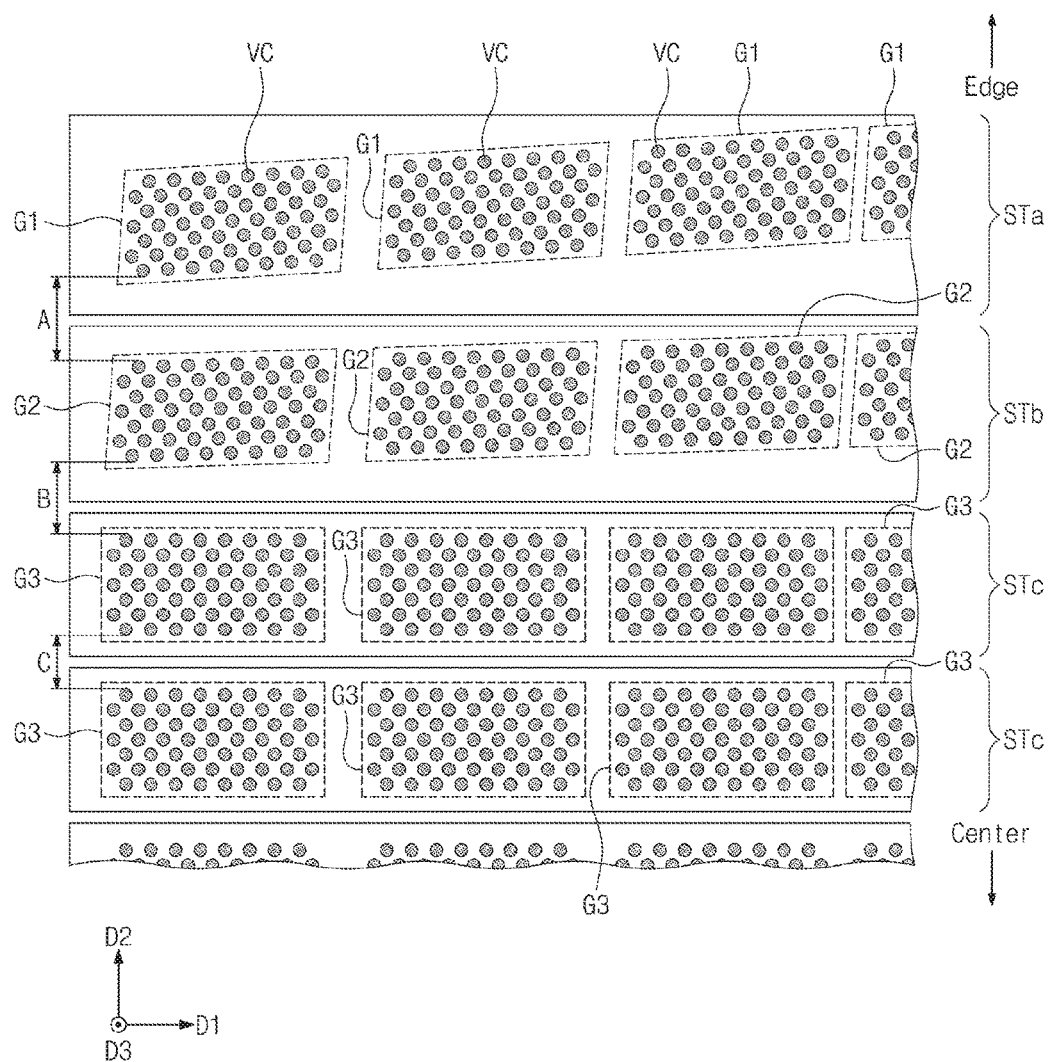

FIGS. 5 and 6 are simplified plan views that illustrate a portion of a three-dimensional semiconductor memory device according to some example embodiments of inventive concepts. In the embodiments that follow, descriptions of technical features the same as those of the three-dimensional semiconductor memory device discussed above with reference to FIG. 3 may be omitted in the interest of brevity of explanation.

According to some embodiments, as illustrated in FIG. 5, a plurality of the channel groups G1 G2, and G3 may be arranged spaced apart along the first and second directions D1 and D2. Each of the channel groups G1, G2, and G3 may include the vertical channels VC, which extend in the third direction D3 perpendicular to the top surface of the substrate (see 100 of FIG. 3B or 4B) and which are arranged along the first and second directions D1 and D2.

For example, the channel groups G1, G2, and G3 may include a plurality of the first channel groups G1, a plurality of the second channel groups G2, and a plurality of the third channel groups G3. The first to third channel groups G1, G2, and G3 may be respectively provided in the first to third electrode structures STa, STb, and STc that extend in the first direction D1 For example, the first to third electrode structures STa to STc extending in the first direction D1 may be spaced apart from each other in the second direction D2.

A distance between adjacent ones of the first to third channel groups G1, G2, and G3 may increase as approaching the edge portion of the cell array region from the central portion of the cell array region. For example, the first channel groups G1 in the first electrode structure STa may be spaced apart at a first distance A1 from the second channel group G2 in the second electrode structure STb. The second channel group G2 in the second electrode structure STb may be spaced apart at a second distance B1 from the third channel group G3 in the third electrode structure STc. The third channel groups G3 in the third electrode structure STc may be spaced apart from each other at a third distance C1 less than the second distance B1.

The first electrode structure STa may include a plurality of the first channel groups G1 spaced apart from each other in the first direction D1, and the first channel groups G1 may be spaced apart from each other along the first direction D1 at distances A2, B2, and C2 that increase as approaching the edge portion of the cell array region from the central portion of the cell array region. Likewise, the second and third channel groups G2 and G3 may also be spaced apart along the first direction D1 from each other at different distances A2, B2, and C2.

According to some embodiments, as illustrated in FIG. 6, the first and second electrode structures STa and STb on the edge portion of the cell array region may include the vertical channels VC arranged along a diagonal direction to the first and second directions D1 and D2. For example, the first channel groups G1 of the first electrode structure STa may be arranged in a diagonal direction to the first direction D1. In this configuration, the vertical channels VC may be spaced apart from one side of the first electrode structure STa in the second direction D2 at different distances. In addition, the first and second channel groups G1 and G2 may be arranged in a diagonal direction to the second direction D2 as approaching the edge portion of the cell array region from the central portion of the cell array region.

FIGS. 7A to 14A are plan views that illustrates a method of fabricating a three-dimensional semiconductor memory device according to some example embodiments of inventive concepts. FIGS. 7B to 14B are cross-sectional views taken along line I-I' of FIGS. 7A to 14A, respectively, illustrating a method of fabricating a three-dimensional semiconductor memory device according to some example embodiments of inventive concepts.

Figure 7A:
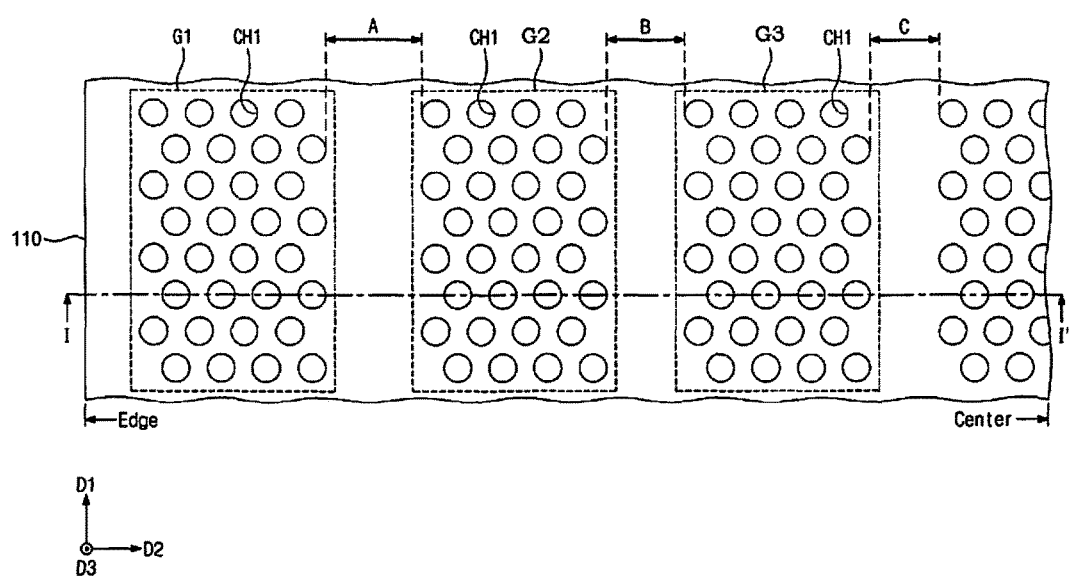
Figure 7B:
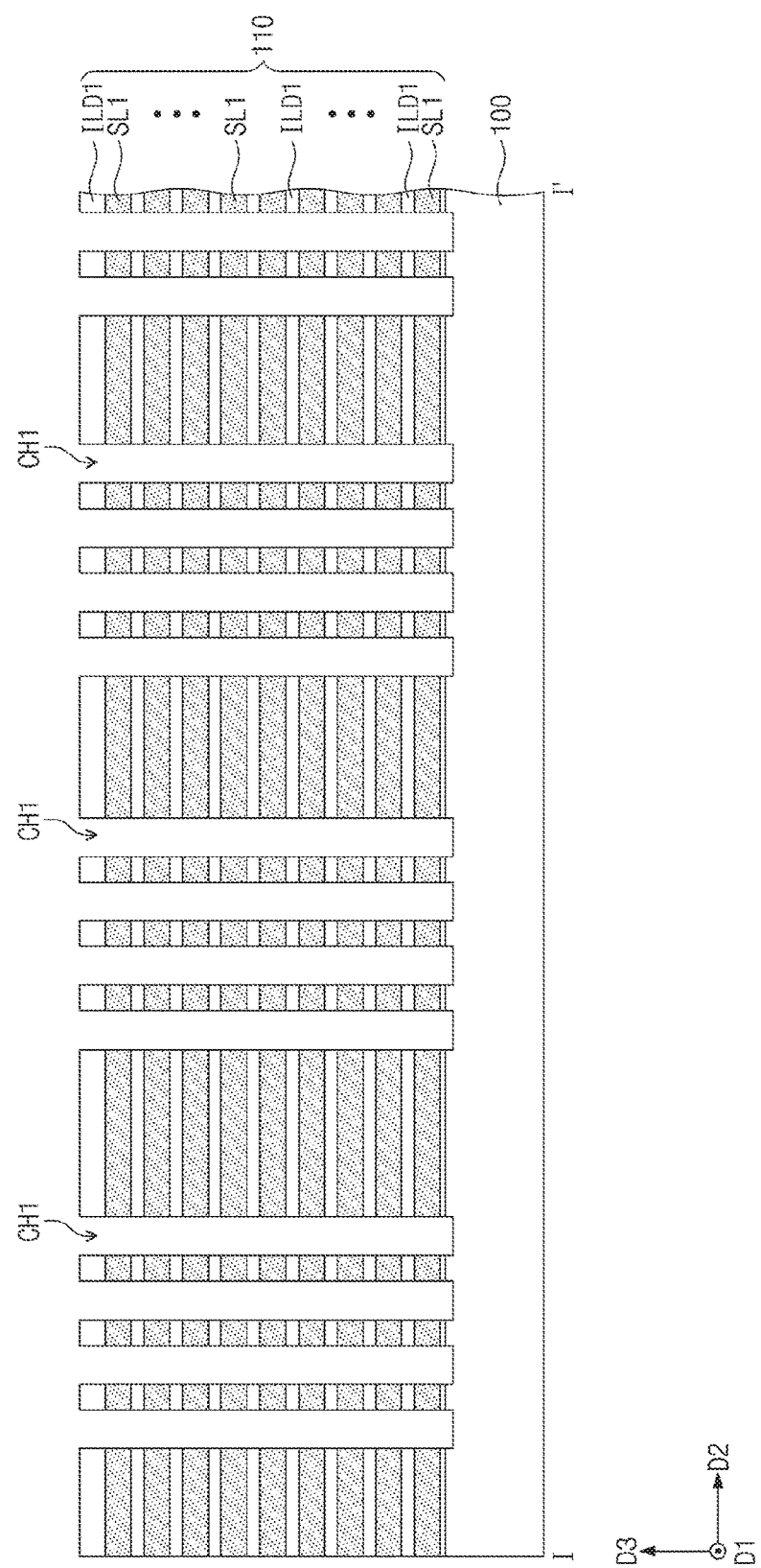

Referring to FIGS. 7A and 7B, a lower mold structure 110 may be formed on a substrate 100. The lower mold structure 110 may be formed by alternately and repeatedly stacking lower insulating layers ILD1 and lower sacrificial layers SL1.

For example, the lower sacrificial layers SL1 and the lower insulating layers ILD1 may include insulating materials having an etch selectivity to each other. For example, the sacrificial layers SL1 may include a silicon nitride layer, and the insulating layers ILD1 may include a silicon oxide layer. Alternatively, the lower sacrificial layers SL1 may include a conductive material, and the lower insulating layers ILD1 may include an insulating material.

Lower channel holes CH1 may be formed to penetrate the lower mold structure 110. The formation of the lower channel holes CH1 may include forming a mask pattern (not shown) on the lower mold structure 110 and performing an anisotropic etching process on the lower mold structure 110 using the mask pattern as an etch mask. The anisotropic etching process may over-etch a top surface of the substrate 100, and thus the substrate 100 may be recessed on its top surface exposed to the lower channel holes CH1. In addition, the anisotropic etching process may cause each lower channel hole CH1 to have a lower width less than an upper width and to have an inclined inner sidewall.

In some embodiments, as like the channel groups discussed with reference to FIGS. 3A and 3B, a plurality of lower channel hole groups G1, G2, and G3 may be provided in the lower mold structure 110. For example, the lower mold structure 110 may be provided therein with first, second, and third lower channel hole groups G1, G2, and G3. The first lower channel hole group G1 may be disposed on an edge portion (designated by symbol Edge) of a cell array region (see CAR of FIG. 1), and the first to third lower channel hole groups G1 to G3 may be sequentially disposed along a second direction D2. As discussed above with reference to FIGS. 3A and 3B, the first to third lower channel hole groups G1 to G3 may be spaced apart from each other at distances A, B, and C that decrease along the second direction D2 as approaching a central portion (designated by symbol Center) of the cell array region from the edge portion of the cell array region. For example, A>B>C. A plurality of the third lower channel hole groups G3 may be substantially equally spaced apart from each other at a third distance C.

Each of the first to third channel groups G1 to G3 may include a plurality of the lower channel holes CH1 arranged along the first and second directions D1 and D2. In some embodiments, the first to third lower channel hole groups G1 to G3 may have substantially the same number and arrangement of the lower channel holes CH1.

Figure 8A:
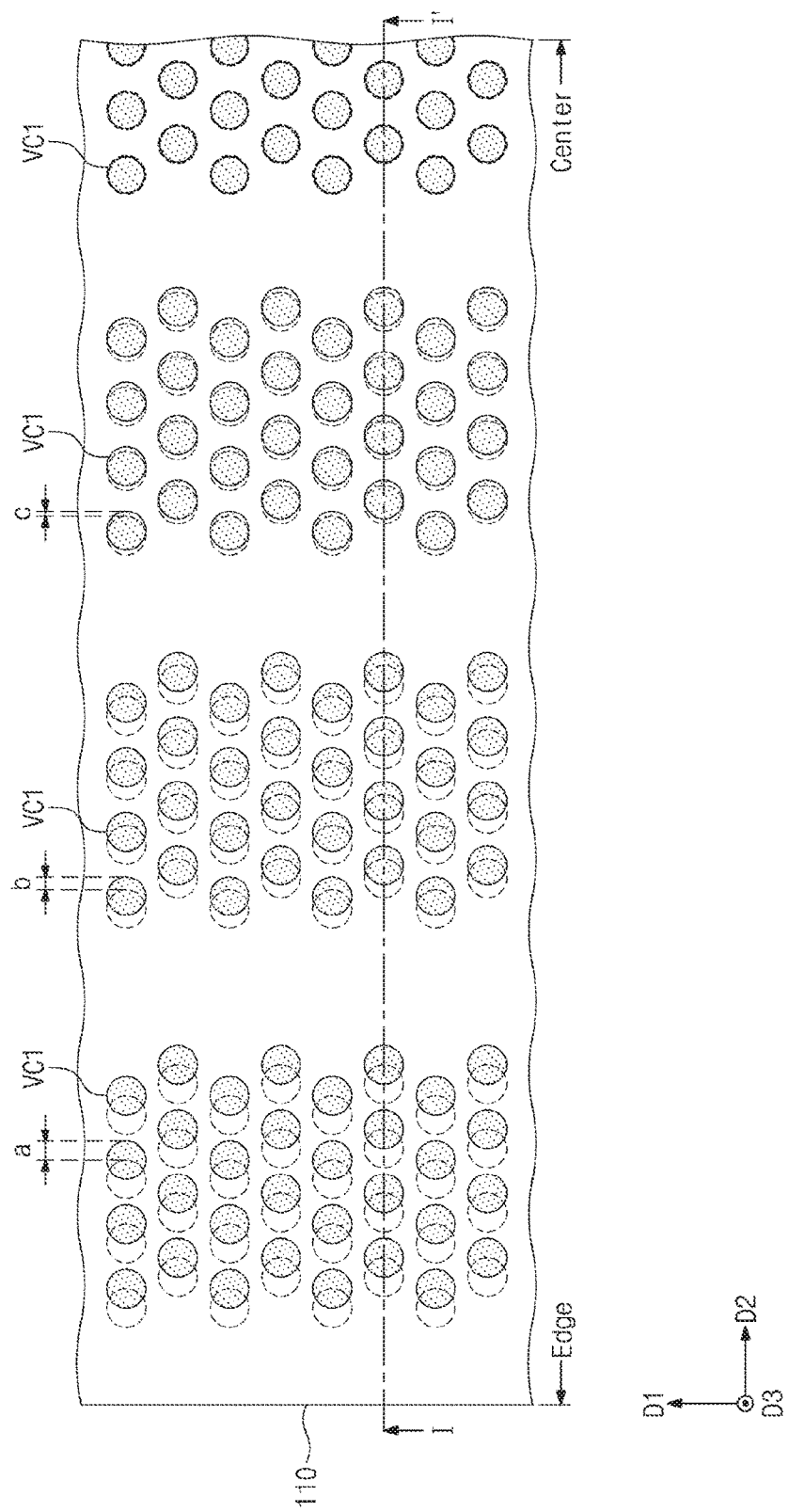

Referring to FIGS. 8A and 8B, lower vertical channels VC1 may be formed in the lower channel holes CH1. The lower vertical channels VC1 may be in contact with the substrate 100, and may have a macaroni or pipe shape with a closed bottom end. The lower vertical channels VC1 may be filled therein with an insulating material or air. The lower vertical channels VC1 may include silicon (Si), germanium (Ge), or a mixture thereof, and may be either an impurity-doped semiconductor or an impurity-undoped intrinsic semiconductor. The lower vertical channels VC1 may have one or more of a single crystalline structure, an amorphous structure, and a polycrystalline structure. A connection pad PAD1 may be formed on or at each top end of the lower vertical channels VC1. The connection pad PAD1 may include an impurity-doped semiconductor material, an impurity-undoped semiconductor material, or a conductive material.

In some embodiments, a lower vertical insulating pattern VP1 may be formed between the lower vertical channel VC1 and the lower mold structure 110. The formation of the lower vertical insulating pattern VP1 may be followed by the formation of the lower vertical channel VC1. The lower vertical insulating pattern VP1 may include a single thin layer or a plurality of thin layers. In some embodiments, the lower vertical insulating pattern VP1 may include a charge storage layer used as a memory element of NAND Flash memory devices. For example, the charge storage layer may be a trap insulating layer or an insulating layer including conductive nano-dots. Alternatively, the lower vertical insulating pattern VP1 may include a thin layer for a phase change memory device or a changeable resistance memory device. For example, referring to FIG. 26, the lower vertical insulating pattern VP1 may include a tunnel insulating layer TIL and a charge storage layer CL as a part of a memory element of NAND Flash memory devices.

In some embodiments, before or after the lower vertical channels VC1 are formed, the lower mold structure 110 may be shrunk or expanded due to applied stress. For example, after the lower vertical channels VC1 are formed, an annealing process may be performed on the lower vertical channels VC1, and as a result, the lower mold structure 110 may be shrunk. The lower mold structure 110 may experience shrinkage along first and second directions D1 and D2 parallel to the top surface of the substrate 100. Accordingly, on an edge portion of the lower mold structure 110, the lower vertical channels VC1 may become curved or bent toward the central portion of the cell array region. For example, compared to lower portions of the lower vertical channels VC1, upper portions of the lower vertical channels VC1 may move toward a center of the lower mold structure 110. In FIG. 8A, dotted lines may indicate bottom surfaces (or their positions) of the lower vertical channels VC1, while solid lines may denote top surfaces (or their positions) of the lower vertical channels VC1. Movement displacements a, b, and c of the upper portions of the lower vertical channels VC1 may decrease as approaching the center of the lower mold structure 110 from the edge of the lower mold structure 110. For example, a>b>c. Although the present embodiment discusses the shrinkage of the lower mold structure 110, inventive concepts are not limited thereto but not exclude expansion of the lower mold structure 110.

Figure 9A:
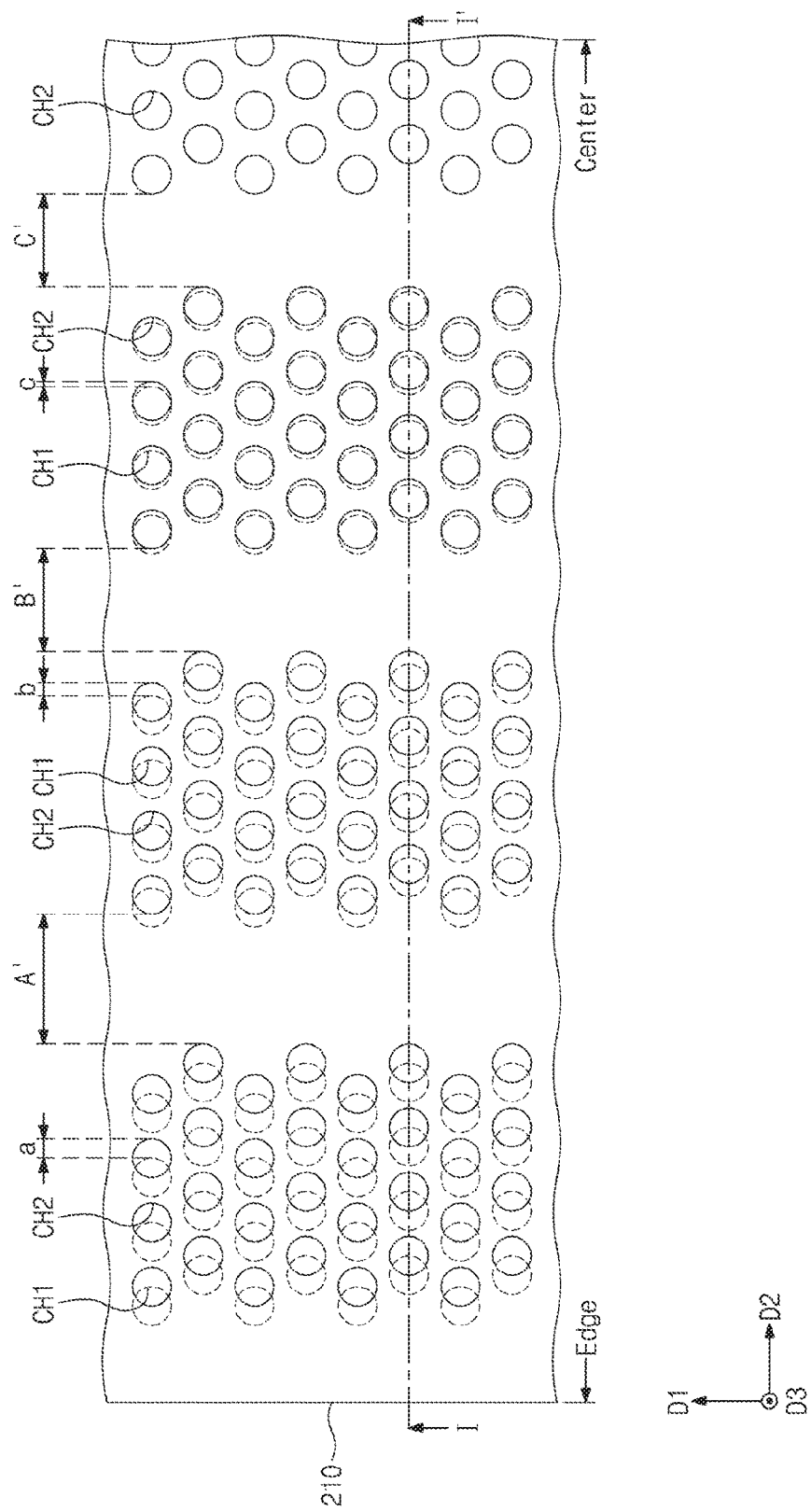

Referring to FIGS. 9A and 9B, an upper mold structure 210 may be formed on the lower mold structure 110 in which the lower vertical channels VC1 are formed. The upper mold structure 210 may be formed by alternately and repeatedly stacking upper insulating layers ILD2 and upper sacrificial layers SL2 on the lower mold structure 110. In some embodiments, the upper sacrificial layer SL2 may include the same material as those of the lower sacrificial layer SL1, and have substantially the same thickness as those of the lower sacrificial layer SL1.

Upper channel holes CH2 may be formed to penetrate the upper mold structure 210. The formation of the upper channel holes CH2 may include forming a mask pattern (not shown) on the upper mold structure 210 and performing an anisotropic etching process on the upper mold structure 210 using the mask pattern as an etch mask. The anisotropic etching process may over-etch top surfaces of the connection pads PAD1 on the lower vertical channels VC1, and thus the connection pads PAD1 may be recessed on their top surfaces exposed to the upper channel holes CH2. In addition, the anisotropic etching process may cause each upper channel hole CH2 to have a lower width less than an upper width and to have an inclined inner sidewall.

Likewise the first to third channel groups discussed above with reference to FIGS. 3A and 3B, a plurality of upper channel hole groups may be provided in the upper mold structure 210. Each of the upper channel hole groups may include the upper channel holes CH2 arranged along the first and second directions D1 and D2. Positions of the upper channel holes CH2 may be different from those of the lower channel holes CH1 discussed with reference to FIG. 7A. On an edge of the upper mold structure 210, compared to the lower channel holes CH1, the upper channel holes CH2 may move toward the central portion of the cell array region.

In some embodiments, the upper channel hole groups may be spaced apart at distances A', B', and C' that decrease along the second direction D2 as approaching the central portion of the cell array region from the edge portion of the cell array region. For example, A'>B'>C'. The distances A', B', and C' between the upper channel groups may be substantially the same as or less than the distances A, B, and C, respectively, between the lower channel groups.

Figure 10B:
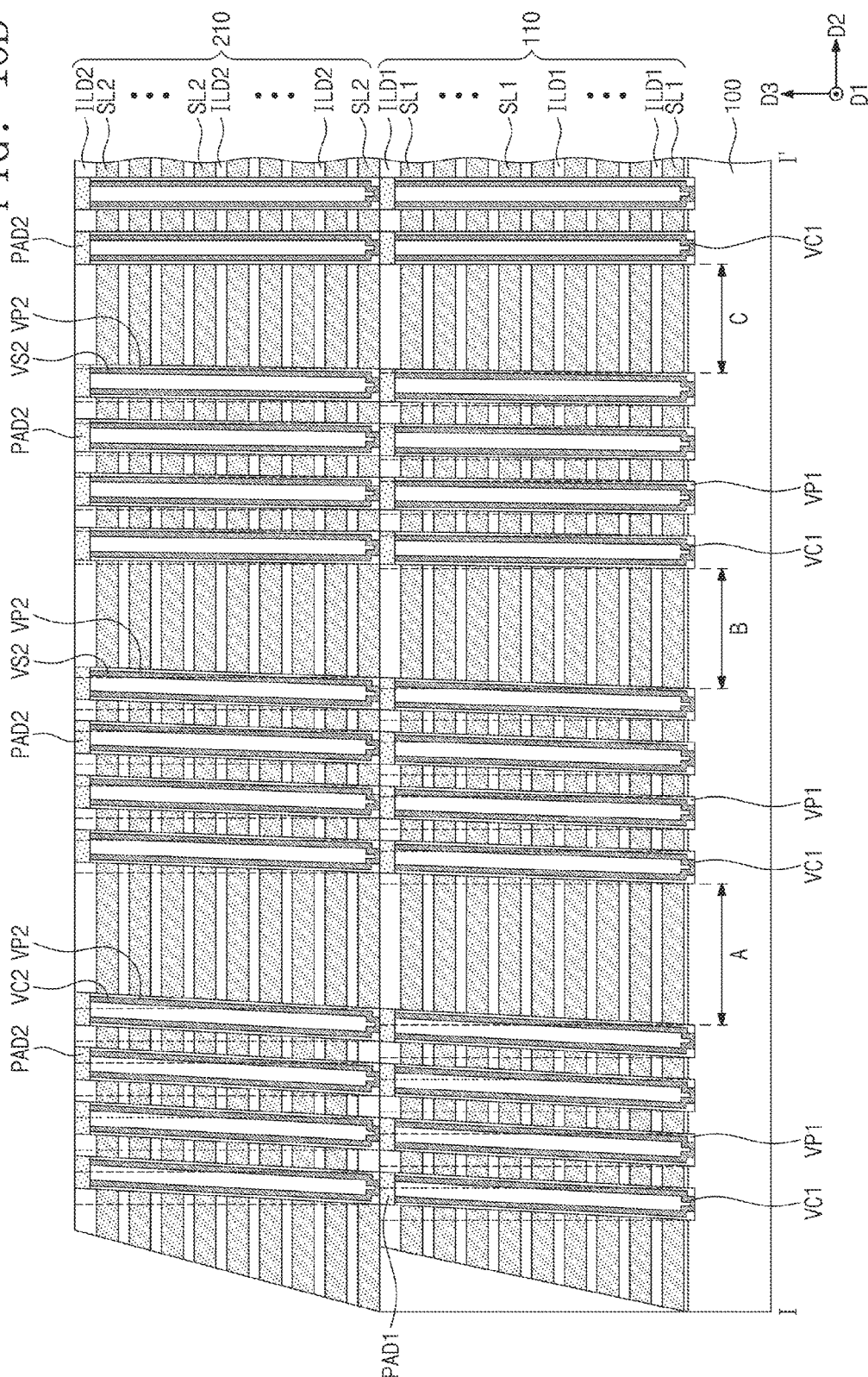

Referring to FIGS. 10A and 10B, upper vertical channels VC2 may be formed in the upper channel holes CH2. The upper vertical channels VC2 may be electrically connected to corresponding lower vertical channels VC1. The upper vertical channels VC2 may be in contact with the connection pads PAD1 on the lower vertical channels VC1, and may have a macaroni or pipe shape with a closed bottom end. The upper vertical channels VC2 may be filled therein with an insulating material or air. The upper vertical channels VC2 may be formed using the same material and process as those of the lower vertical channels VC1.

A bit line pad PAD2 may be formed on or at each top end of the upper vertical channels VC2. The bit line pad PAD2 may include an impurity-undoped semiconductor material, an impurity-doped semiconductor material, or a conductive material.

Before the upper vertical channels VC2 are formed, an upper vertical insulating pattern VP2 may be formed between the upper mold structure 210 and the upper vertical channel VC2. The upper vertical insulating pattern VP2 may have substantially the same thin-layer structure as that of the lower vertical insulating pattern VP1. In some embodiments, the upper vertical insulating pattern VP2 may be a part of a data storage layer of charge trap-type Flash memory transistors.

As discussed above, after the upper vertical channels VC2 are formed, the upper mold structure 210 may be shrank or expanded at high-temperature processes. Accordingly, on the edge of the upper mold structure 210, the upper vertical channels VC2 may become curved or bent toward the central portion of the cell array region. For example, compared to lower portions of the upper vertical channels VC2, upper portions of the upper vertical channels VC2 may move toward a center of the upper mold structure 210. In FIG. 10A, dotted line may indicate bottom surfaces (or their positions) of the upper vertical channels VC2, while solid lines may denote top surfaces (or their positions) of the upper vertical channels VC2. Movement displacements of the upper portions of the upper vertical channels VC2 may decrease as approaching the center of the upper mold structure 210 from the edge of the upper mold structure 210.

Figure 11A:
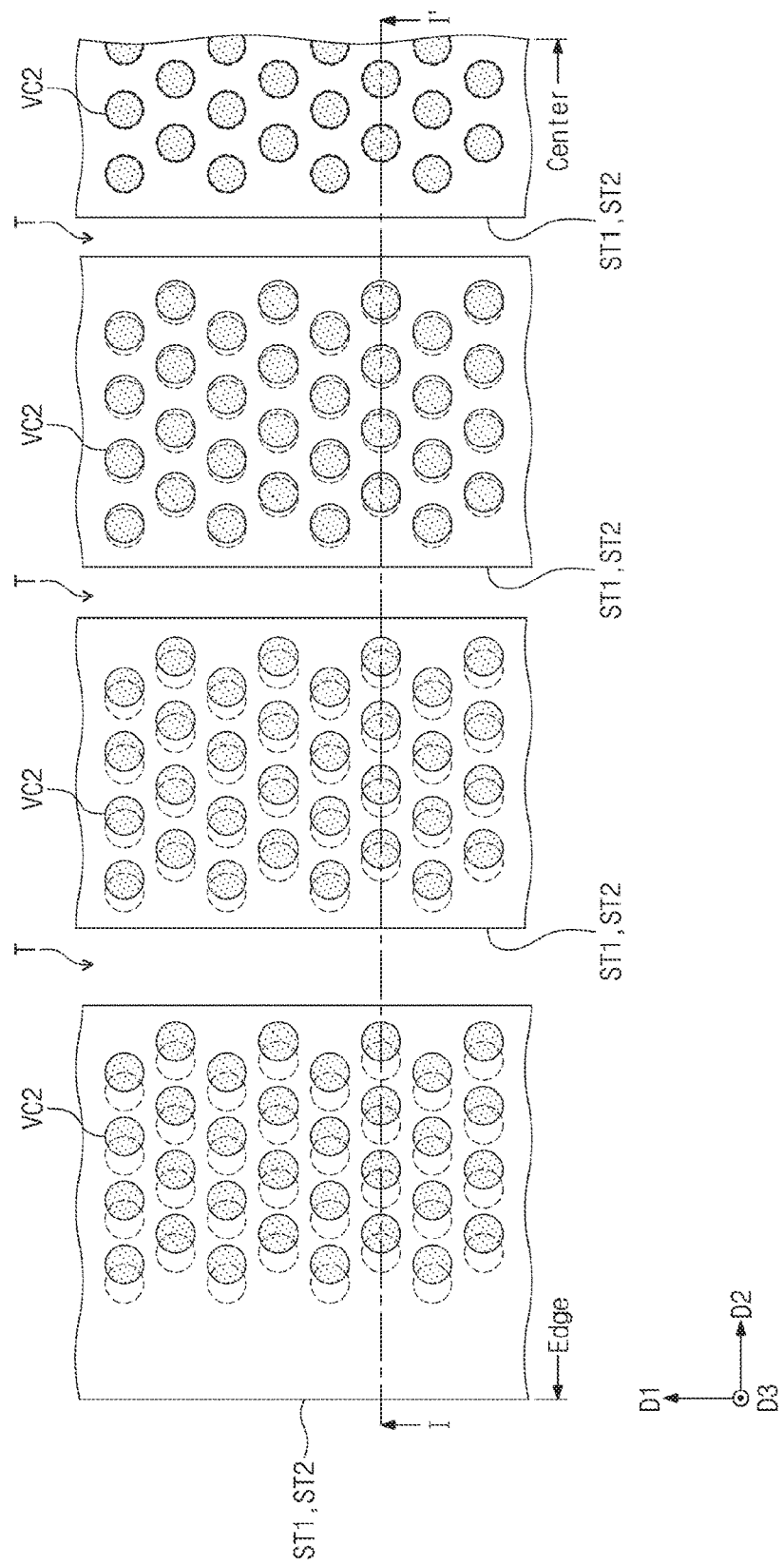
Figure 11B:
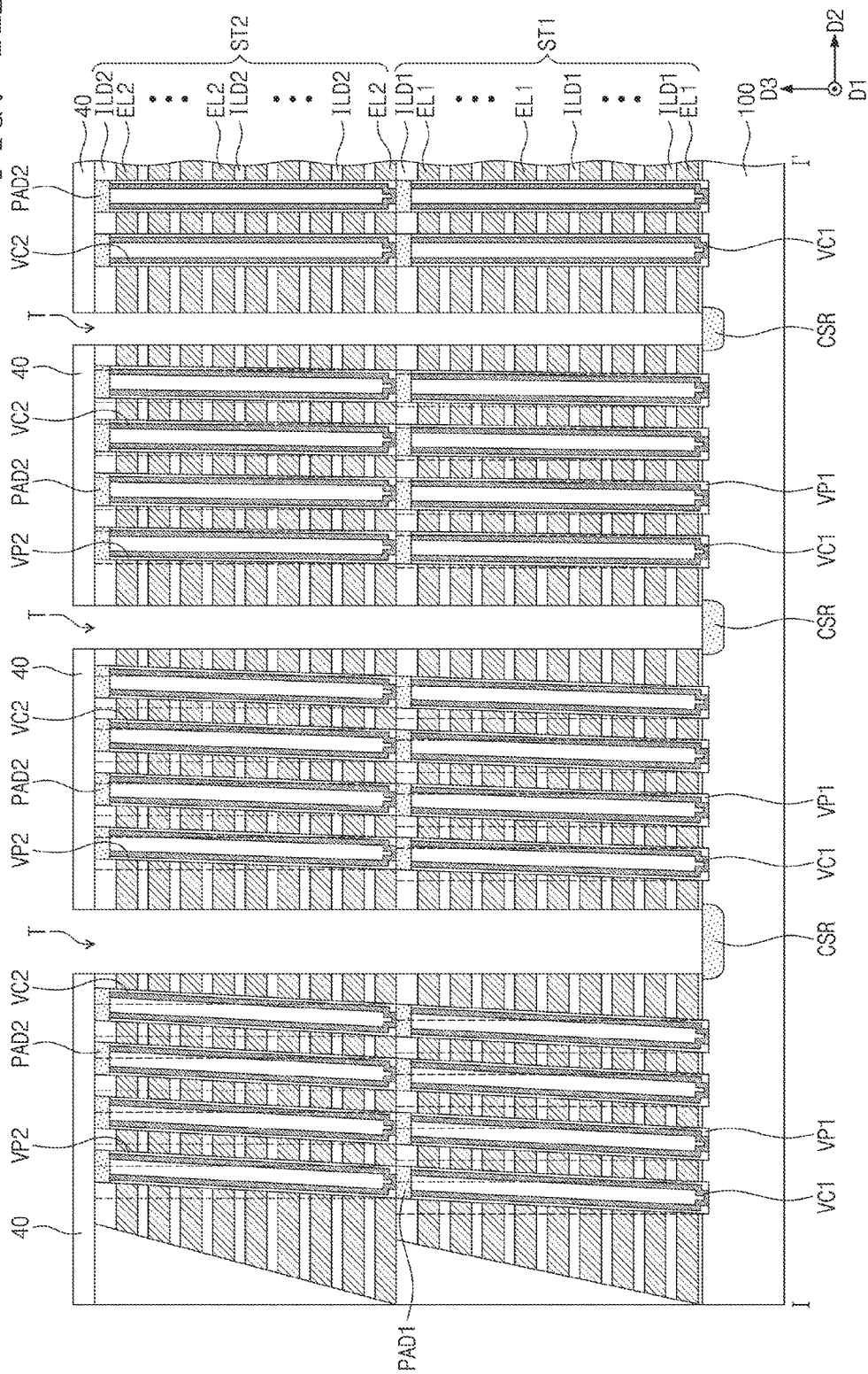

Referring to FIGS. 11A and 11B, the lower sacrificial layers SL1 and the upper sacrificial layers SL2 may be respectively replaced with lower electrodes EL1 and upper electrodes EL2.

For example, the formation of the lower and upper electrodes EL1 and EL2 may include forming trenches T to penetrate the lower and upper mold structures 110 and 210, removing the lower and upper sacrificial layers SL1 and SL2 exposed to the trenches T to form lower and upper gate regions, and forming the upper and lower electrodes EL1 and EL2 in the lower and upper gate regions.

The formation of the trenches T may include forming a capping insulating layer 40 to cover top surfaces of the upper vertical channels VC2, forming on the capping insulating layer 40 a mask pattern (not shown) defining planar positions of the trenches T, and anisotropically etching the upper and lower mold structures 210 and 110 using the mask pattern as an etch mask. For example, the trenches T may have widths that decrease as approaching the central portion of the cell array region from the edge portion of the cell array region. Upper and lower mold patterns defined by the trenches T may have substantially the same width. Alternatively, as illustrated in FIGS. 13A and 133B, the trenches T may have substantially the same width. In this case, the upper and lower mold patterns defined by the trenches T may have different widths from each other.

Although FIG. 11B illustrates an example where the trenches T continuously penetrate the upper and lower mold structures 210 and 110, inventive concepts are not limited thereto. For example, lower trenches and upper trenches may be separately formed in individual processes. In this case, the formation of lower trenches penetrating the lower mold structure 110 may be followed by the formation of the upper mold structure 210.

Figure 13B:
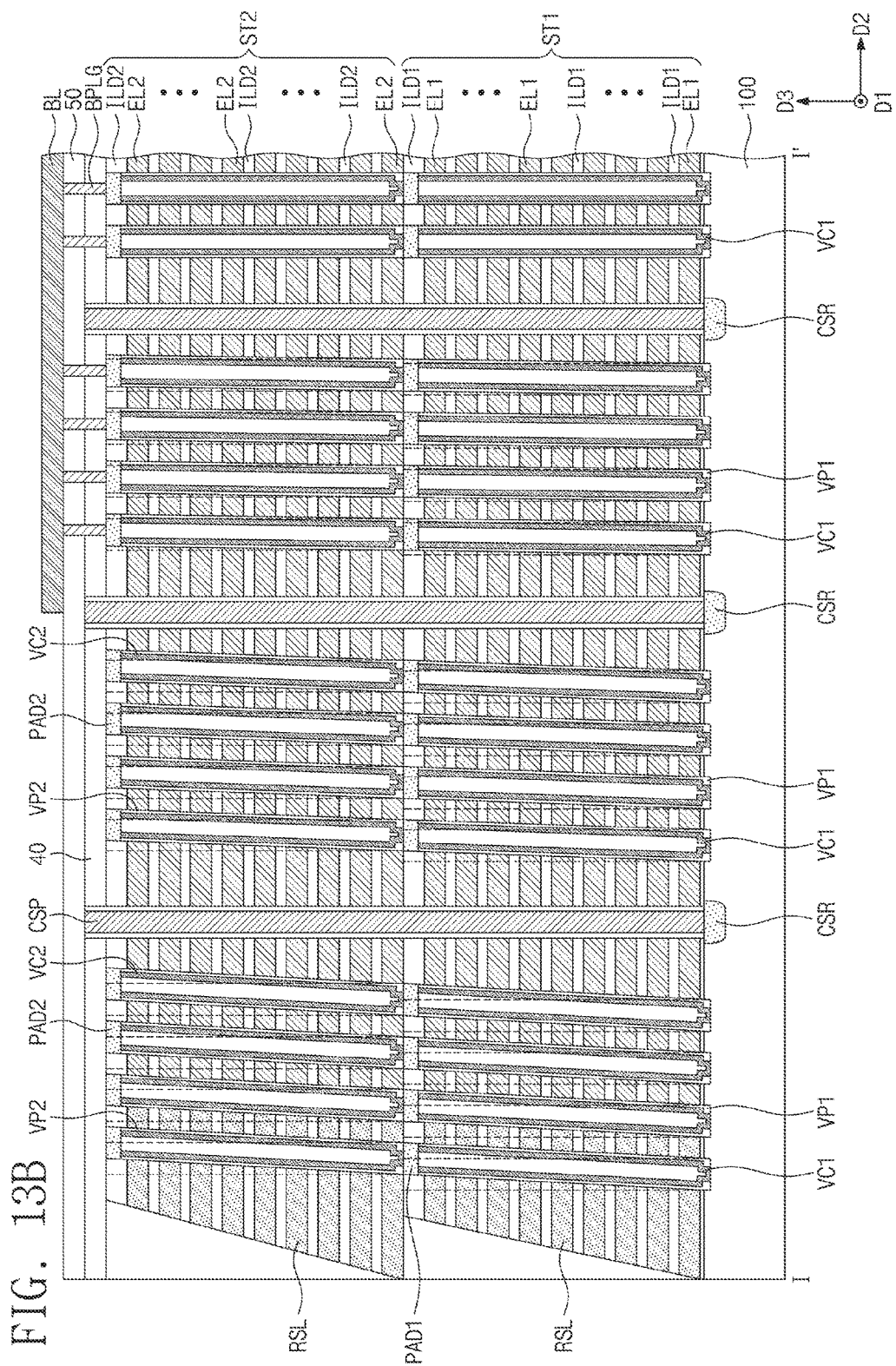

The formation of the lower and upper gate regions may include etching the lower and upper sacrificial layers SL1 and SL2 to expose the lower and upper vertical insulating patterns VP1 and VP2. The lower and upper sacrificial layers SL1 and SL2 may be isotropically etched using an etch recipe that exhibits an etch selectivity to the lower and upper insulating layers ILD1 and ILD2, the lower and upper vertical insulating patterns VP1 and VP2, and the substrate 100. In some embodiments, as illustrated in FIGS. 13A and 13B, when the lower and upper gate regions are formed, the lower and upper sacrificial layers SL1 and SL2 may be incompletely removed on the edge portion of the cell array region (or on the edges of the lower and upper mold structures 110 and 210), thereby leaving residues RSL of the lower and upper sacrificial layers SL1 and SL2 on the edge portion of the cell array region (or on the edges of the lower and upper mold structures 110 and 210).

The lower and upper electrodes EL1 and EL2 may extend in the first direction D1 and may surround the lower and upper vertical channels VC1 and VC2. The lower and upper electrodes EL1 and EL2 may be simultaneously formed and may include the same material. In some embodiments, the formation of the lower and upper electrodes EL1 and EL2 may include depositing a gate conductive layer to fill the lower and upper gate regions, removing the gate conductive layer formed in the trenches T to form the lower and upper electrodes EL1 and EL2 locally provided in the lower and upper gate regions.

Figure 26:
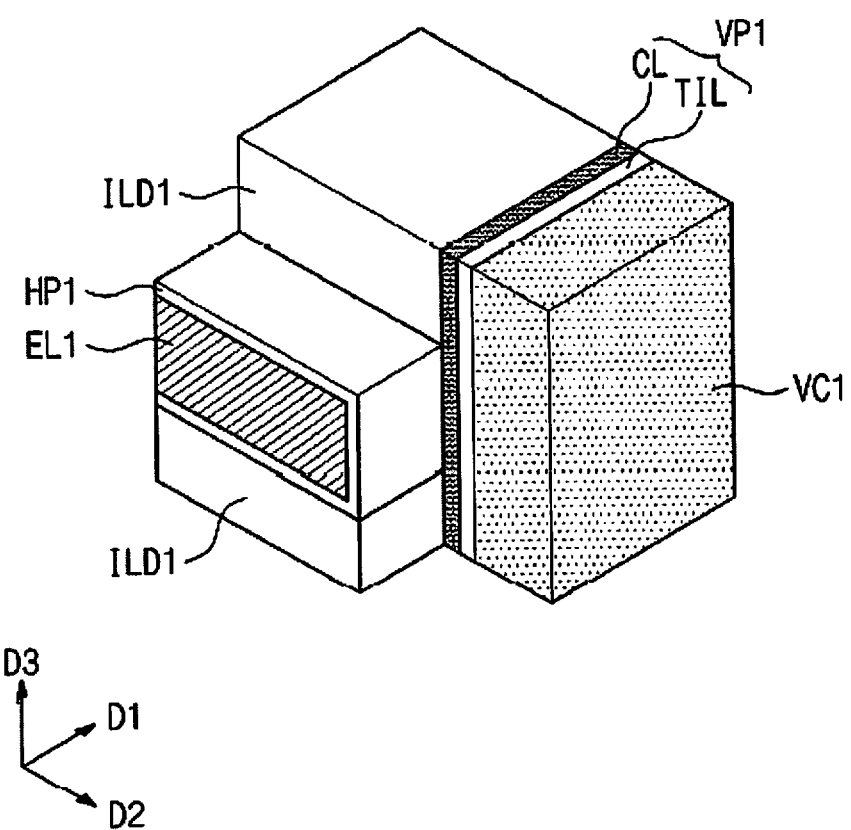
FIG. 26 is a perspective view that illustrates a three-dimensional semiconductor memory device according to some example embodiments of inventive concepts.

Before the lower and upper electrodes EL1 and EL2 are formed, a horizontal insulating pattern (see HP1 of FIG. 26) may be formed to conformally cover inner walls of the lower and upper gate regions. The horizontal insulating pattern HP1 may, as illustrated in FIG. 26, horizontally extend from a sidewall of each lower electrode EL1 to cover bottom and top surfaces of each lower electrode EL1. Likewise, the horizontal insulating pattern HP1 may surround a sidewall and bottom and top surfaces of the upper electrode EL2. In some embodiments, the horizontal insulating pattern HP1 may be a part of a data storage layer of charge trap-type Flash memory transistors.

When the formation of the lower and upper electrodes EL1 and EL2 is done, the substrate 100 may be provided thereon with a lower electrode structure ST1 and an upper electrode structure ST2 that are sequentially stacked. The lower electrode structure ST1 may include a plurality of the lower electrodes EL1, and the upper electrode structure ST2 may include a plurality of the upper electrodes EL2.

Although FIG. 11B illustrates the number of the lower electrodes EL1 is the same as that of the upper electrodes EL2, inventive concepts are not limited thereto. For example, the numbers of the lower and upper electrodes EL1 and EL2 may be different from each other.

After the lower and upper electrode structures ST1 and ST2 are formed, common source regions CSR may be formed in the substrate 100 exposed to the trenches T. The common source regions CSR may extend in the first direction D1. The common source regions CSR may be formed by doping the substrate 100 with an impurity whose conductivity is different from that of the substrate 100.

Figure 12B:
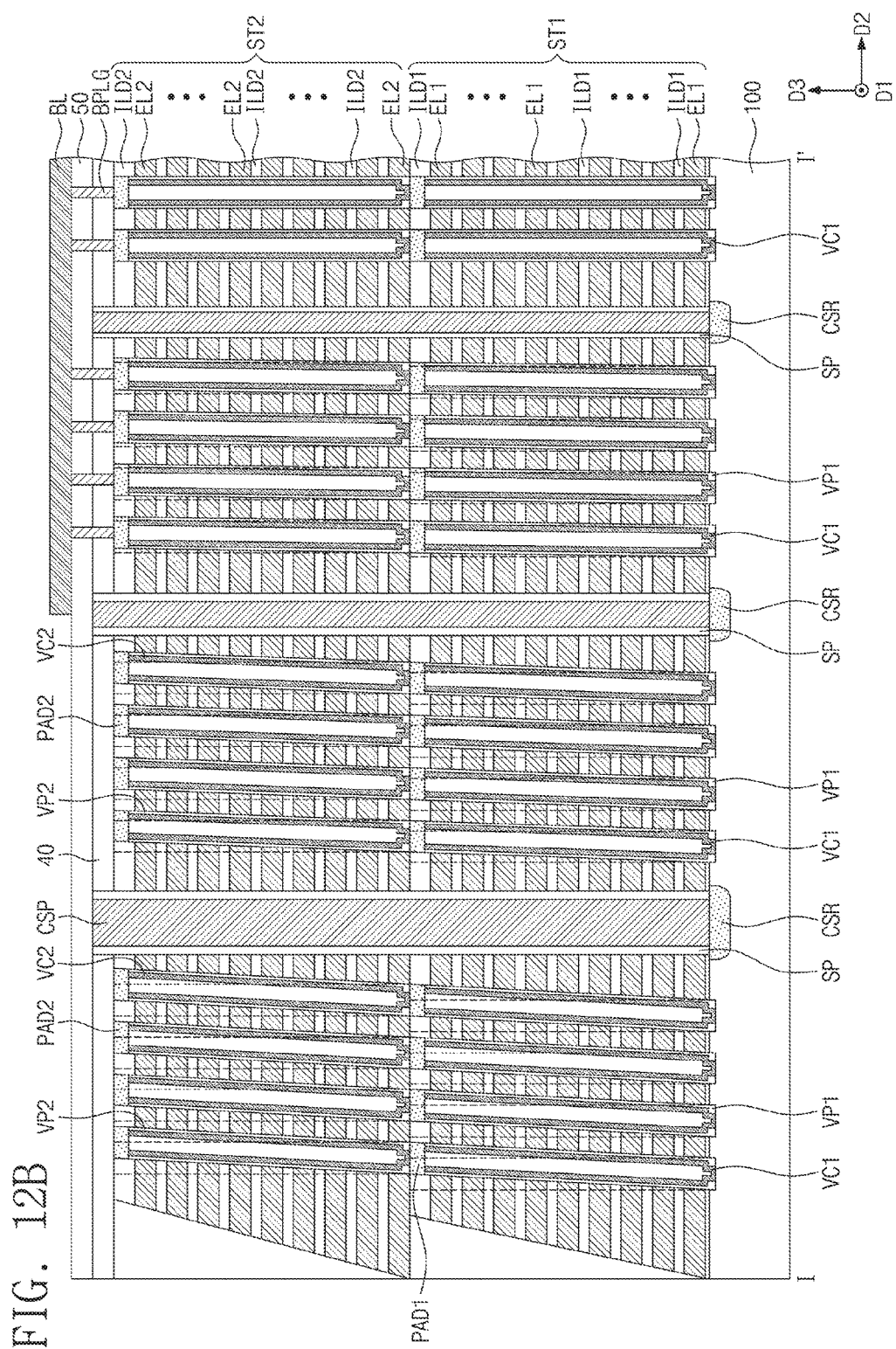

Referring to FIGS. 12A and 12B, after the lower and upper electrode structures ST1 and ST2 are formed, an insulating spacer SP and a common source plug CSP may be formed in each of the trenches T. For example, the common source plug CSP may have a substantially uniform upper width and extend in the first direction D1. For example, the insulating spacer SP may be interposed between the common source plug CSP and opposite sidewalls of the lower and upper electrode structures ST1 and ST2. Alternatively, the common source plug CSP may penetrate a buried insulating layer filling the trench T and be locally coupled to the common source region CSR.

A bit line BL may be formed on an interlayer dielectric layer 50 on the capping insulating layer 40 and may extend in the second direction D2. The bit line BL may be connected through a bit line contact plug BPLG to the bit line pad PAD2.

Figure 14B:
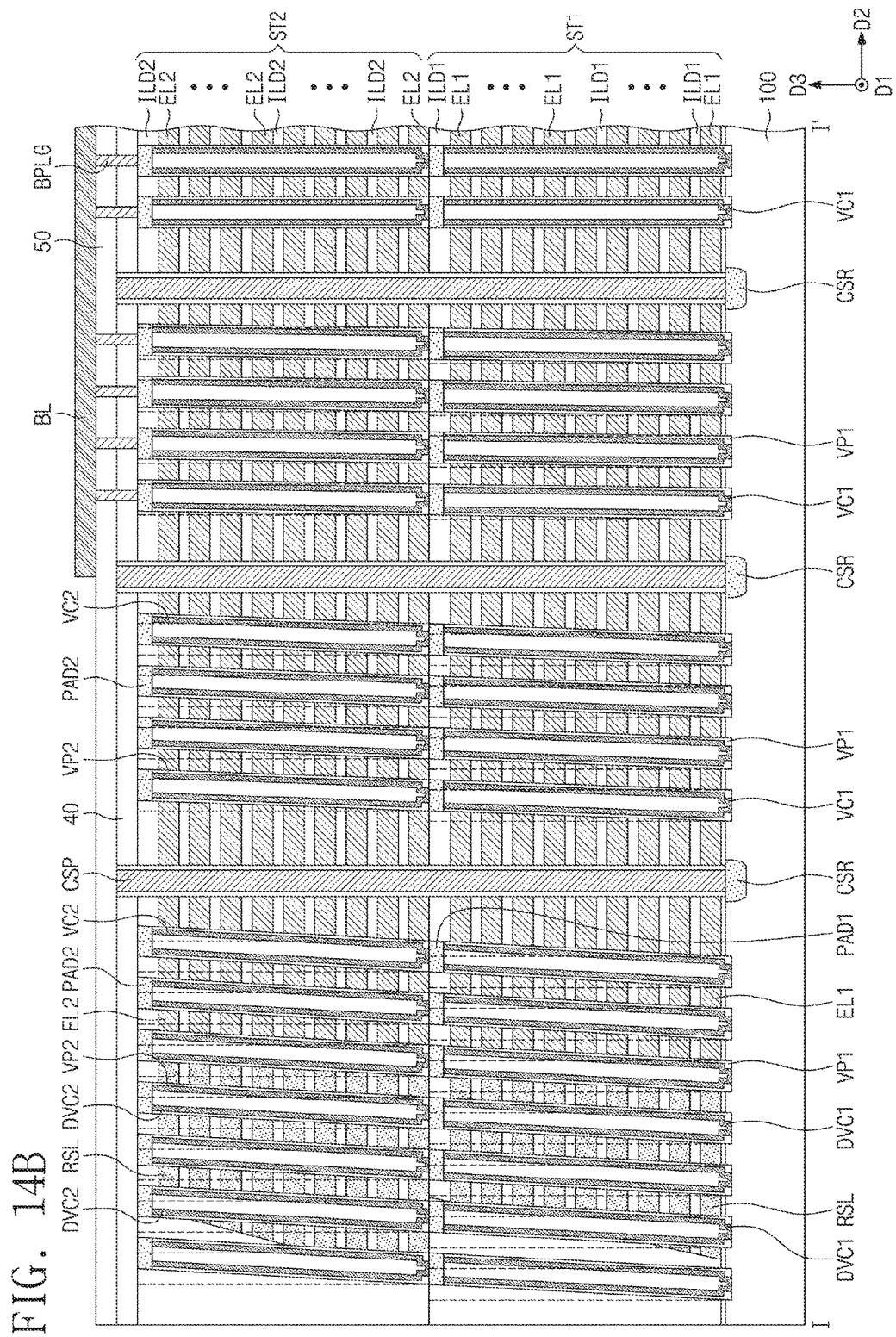

According to some embodiments, as shown in FIGS. 14A and 14B, dummy lower vertical channels DVC1 may be further formed to penetrate an edge portion of the lower electrode structure ST1, and dummy upper vertical channels DVC2 may be further formed to penetrate an edge portion of the upper electrode structure ST2. The dummy upper vertical channels DVC2 may be correspondingly connected to the dummy lower vertical channels DVC1.

In some embodiments, compared to the lower and upper vertical channels VC1 and VC2, the dummy lower and upper vertical channels DVC1 and DVC2 may be more obliquely inclined toward the central portion of the cell array region. For example, an acute angle between the top surface of the substrate 100 and a major axis of the dummy lower vertical channel DVC1 may be less than an acute angle between the top surface of the substrate 100 and a major axis of the lower vertical channel VC1.

FIGS. 15 to 25 are cross-sectional views that illustrate a three-dimensional semiconductor memory device according to some example embodiments of inventive concepts. In the embodiments that follow, descriptions of technical features the same as those of the three-dimensional semiconductor memory device and the method of fabricating the same as discussed above may be omitted in the interest of brevity of explanation.

Figure 15:
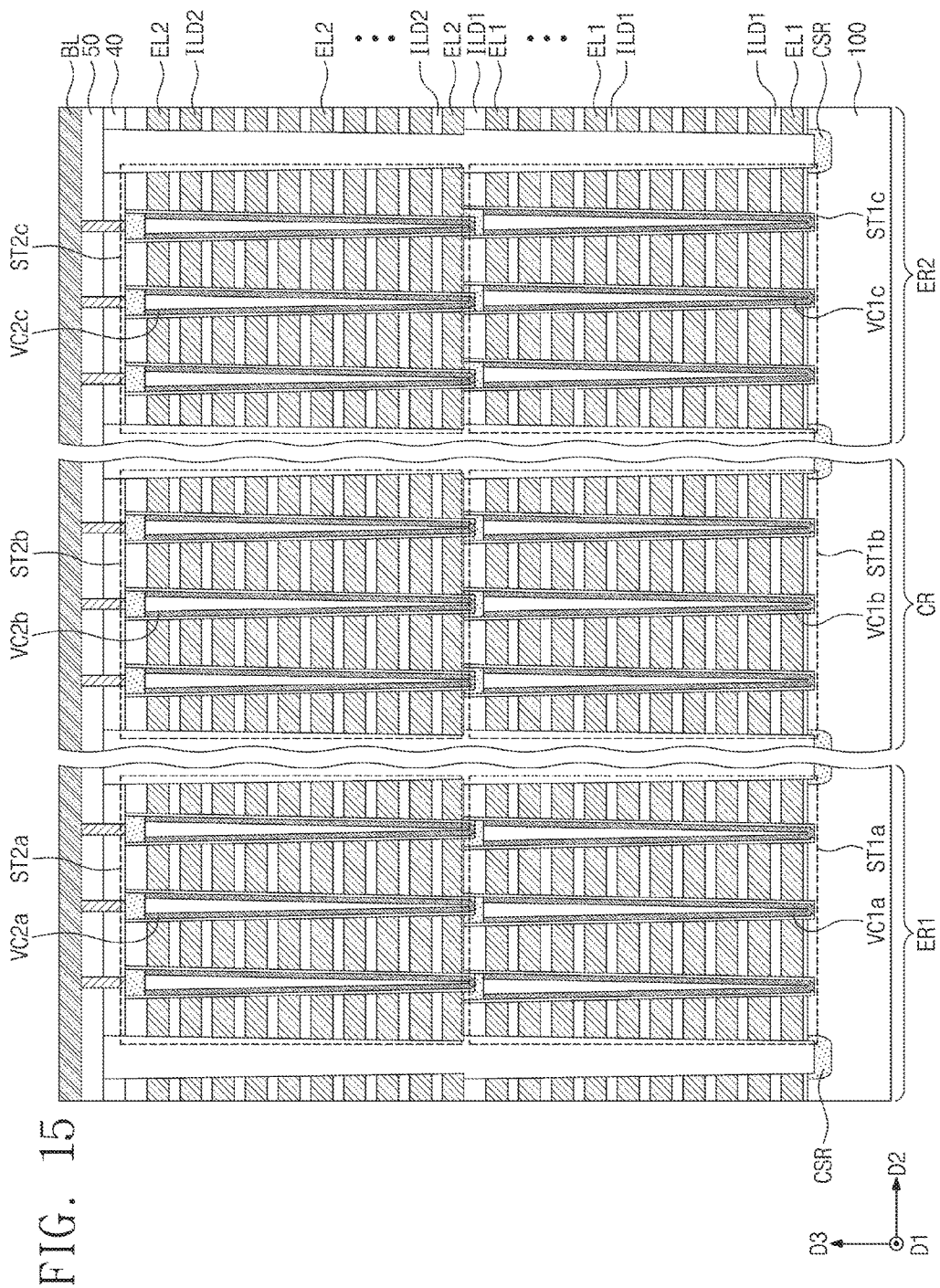
FIGS. 15 to 25 are cross-sectional views that illustrate a three-dimensional semiconductor memory device according to some example embodiments of inventive concepts.

According to some embodiments, as shown in FIG. 15, the substrate 100 may include the first and second edge regions ER1 and ER2 and the central region CR therebetween.

First lower and upper electrode structures ST1a and ST2a may extend in the first direction D1 on the first edge region ER1. Second lower and upper electrode structures ST1b and ST2b may extend in the first direction D1 on the central region CR. Third lower and upper electrode structures ST1c and ST2c may extend in the first direction D1 on the second edge region ER2.

Each of the first to third lower electrode structures ST1a, ST1b, and ST1c may include lower electrodes EL1 and lower insulating layers ILD1 alternately and vertically stacked on the substrate 100, and each of the first to third upper electrode structures ST2a, ST2b, and ST2c may include upper electrodes EL2 and upper insulating layers ILD2 alternately and vertically stacked on the first to third lower electrode structures ST1a, ST1b, and ST1c.

First lower and upper vertical channels VC1a and VC2a may respectively penetrate the first lower and upper electrode structures ST1a and ST2a. Second lower and upper vertical channels VC1b and VC2b may respectively penetrate the second lower and upper electrode structures ST1b and ST2b, and third lower and upper vertical channels VC1c and VC2c may respectively penetrate the third lower and upper electrode structures ST1c and ST2c.

In some embodiments, in each of the first and third lower and upper electrode structures ST1a, ST2a, ST1c, and ST2c, the first and third upper vertical channels VC2a and VC2c may be offset toward the central region CR from the first and third lower vertical channels VC1a and VC1c. In addition, in the second lower and upper electrode structures ST1b and ST2b, the second upper vertical channels VC2b may be vertically aligned with the second lower vertical channels VC1b.

For example, the first lower electrode structure ST1a and the first upper electrode structure ST2a may have sidewalls substantially exactly or roughly aligned with each other in the third direction D3. A distance between the sidewall of the first lower electrode structure ST1a and its adjacent first lower vertical channel VC1a may be greater than a distance between the sidewall of the first upper electrode structure ST2a and its adjacent first upper vertical channel VC2a. In this configuration, the sidewall of the first lower electrode structure ST1a and its adjacent first lower vertical channel VC1a may be spaced apart at a first horizontal distance, and the sidewall of the first upper electrode structure ST2a and its adjacent first upper vertical channel VC2a may be spaced apart at a second horizontal distance different from the first horizontal distance.

A distance between the first and third upper vertical channels VC2a and VC2c most adjacent to each other in the second direction D2 may be less than a distance between the first and third lower vertical channels VC1a and VC1c most adjacent to each other in the second direction D2. In addition, a distance between the first and second upper vertical channels VC2a and VC2b adjacent to each other may be less than a distance between the first and second lower vertical channels VC1a and VC1b adjacent to each other. Likewise, a distance between the second and third upper vertical channels VC2b and VC2c adjacent to each other may be less than a distance between the second and third lower vertical channels VC1b and VC1c adjacent to each other.

Figure 16:
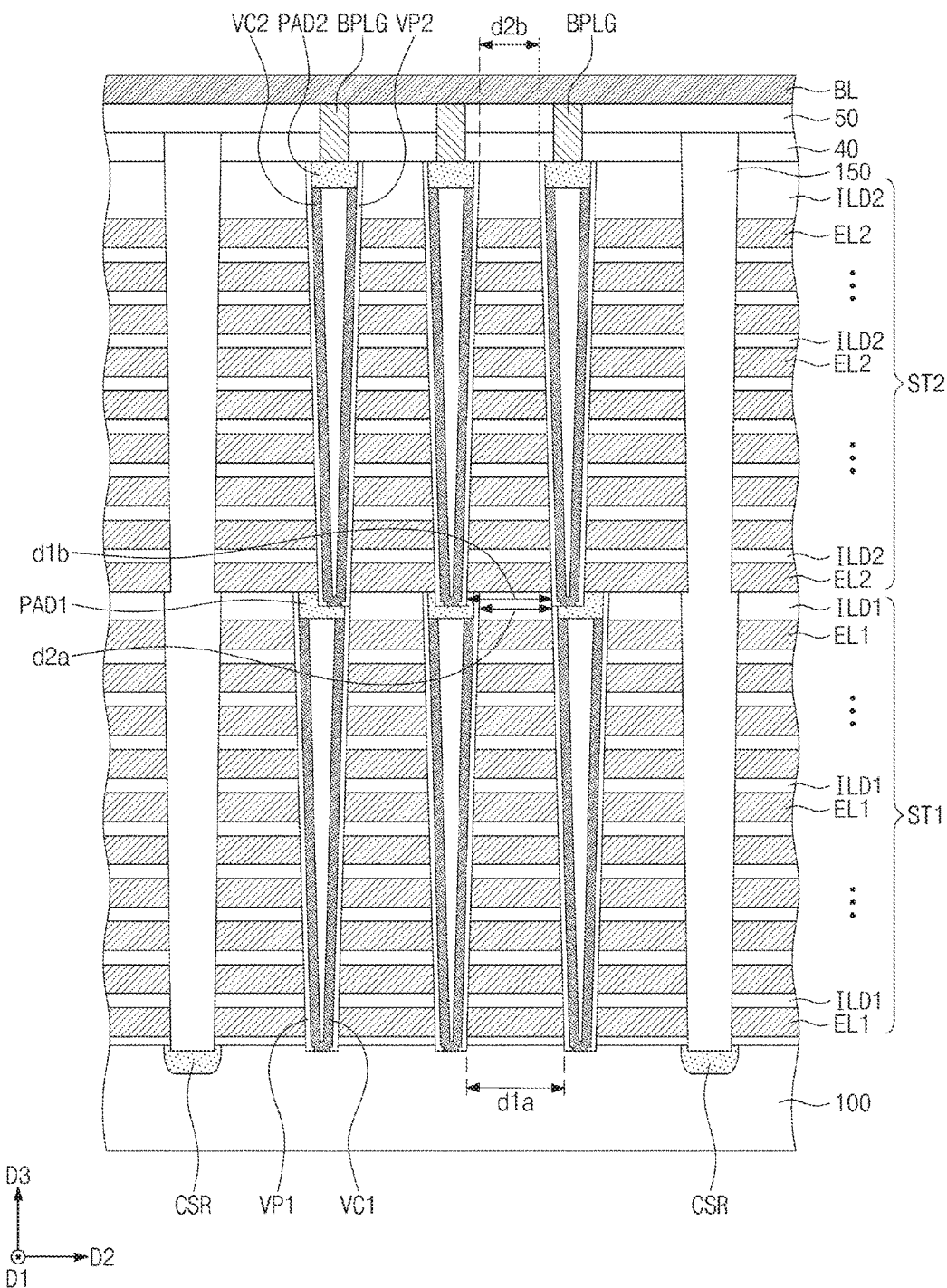

According to some embodiments, as shown in FIG. 16, the lower vertical channels VC1 may penetrate the lower electrode structure ST1, and the upper vertical channels VC2 may penetrate the upper electrode structure ST2 and be connected to corresponding lower vertical channels VC1.

The lower vertical channels VC1 may penetrate the lower electrode structure ST1 and be in contact with the substrate 100. Each of the lower vertical channels VC1 may have a lower width less than an upper width and have an inclined sidewall.

The connection pad PAD1 may be formed on or at each top end of the lower vertical channels VC1. The connection pad PAD1 may include an impurity-doped region or a conductive material. For example, the connection pad PAD1 may be surrounded by a topmost lower insulating layer ILD1. The topmost lower insulating layer ILD1 may be thicker than other lower insulating layers ILD1.

A first vertical insulating pattern VP1 may surround a sidewall of each of the lower vertical channels VC1. The first vertical insulating pattern VP1 may extend between the connection pad PAD1 and the topmost lower insulating layer ILD1. The first vertical insulating pattern VP1 may include a data storage layer that stores data in NAND Flash memory devices. For example, as illustrated in FIG. 26, the first vertical insulating pattern VP1 may include a tunnel insulating layer TIL and a charge storage layer CL that constitute a data storage layer. Alternatively, the first vertical insulating pattern VP1 may include a tunnel insulating layer, a charge storage layer, and a blocking insulating layer that constitute a data storage layer.

The upper vertical channels VC2 may penetrate the upper electrode structure ST2 and be in contact with the connection pads PAD1 on the lower vertical channels VC1. The upper vertical channels VC2 and the lower vertical channels VC1 may have substantially the same structure. Each of the upper vertical channels VC2 may have a lower width less than an upper width, and the lower width of the upper vertical channel VC2 may be less than the upper width of the lower vertical channel VC1. A bottom surface of the upper vertical channel VC2 may be positioned at a level lower than that of the top surface of the connection pad PAD1.

A second vertical insulating pattern VP2 may surround a sidewall of each of the upper vertical channels VC2. The second vertical insulating pattern VP2 may extend between the bit line pad PAD2 and a topmost upper insulating layer ILD2. The second vertical insulating pattern VP2 and the first vertical insulating pattern VP1 may have substantially the same thin-layer structure. For example, the second vertical insulating pattern VP2 may include a tunnel insulating layer, a charge storage layer, and optionally a blocking insulating layer that constitute a data storage layer.

The bit line pad PAD2 may be formed on or at each top end of the upper vertical channels VC2. The bit line pad PAD2 may include an impurity-doped region or a conductive material. For example, a bottom surface of the bit line pad PAD2 may be spaced apart from a top surface of a topmost upper electrode EL2.

In some embodiments, the lower vertical channels VC1 adjacent to each other may be spaced apart from each other in the second direction D2 at a first spacing. A first lower distance d1a between lower portions of the lower vertical channels VC1 may be greater than a first upper distance d2a between upper portions of the lower vertical channels VC1.

On the lower vertical channels VC1, the upper vertical channels VC2 may be spaced apart from each other in the second direction D2 at a second spacing less than the first spacing. A second lower distance d1b between lower portions of the upper vertical channels VC2 may be greater than a second upper distance d2b between upper portions of the upper vertical channels VC2. The second upper distance d2b between upper portions of the upper vertical channels VC2 may be less than the first upper distance d2a between upper portions of the lower vertical channels VC1.

Figure 17:
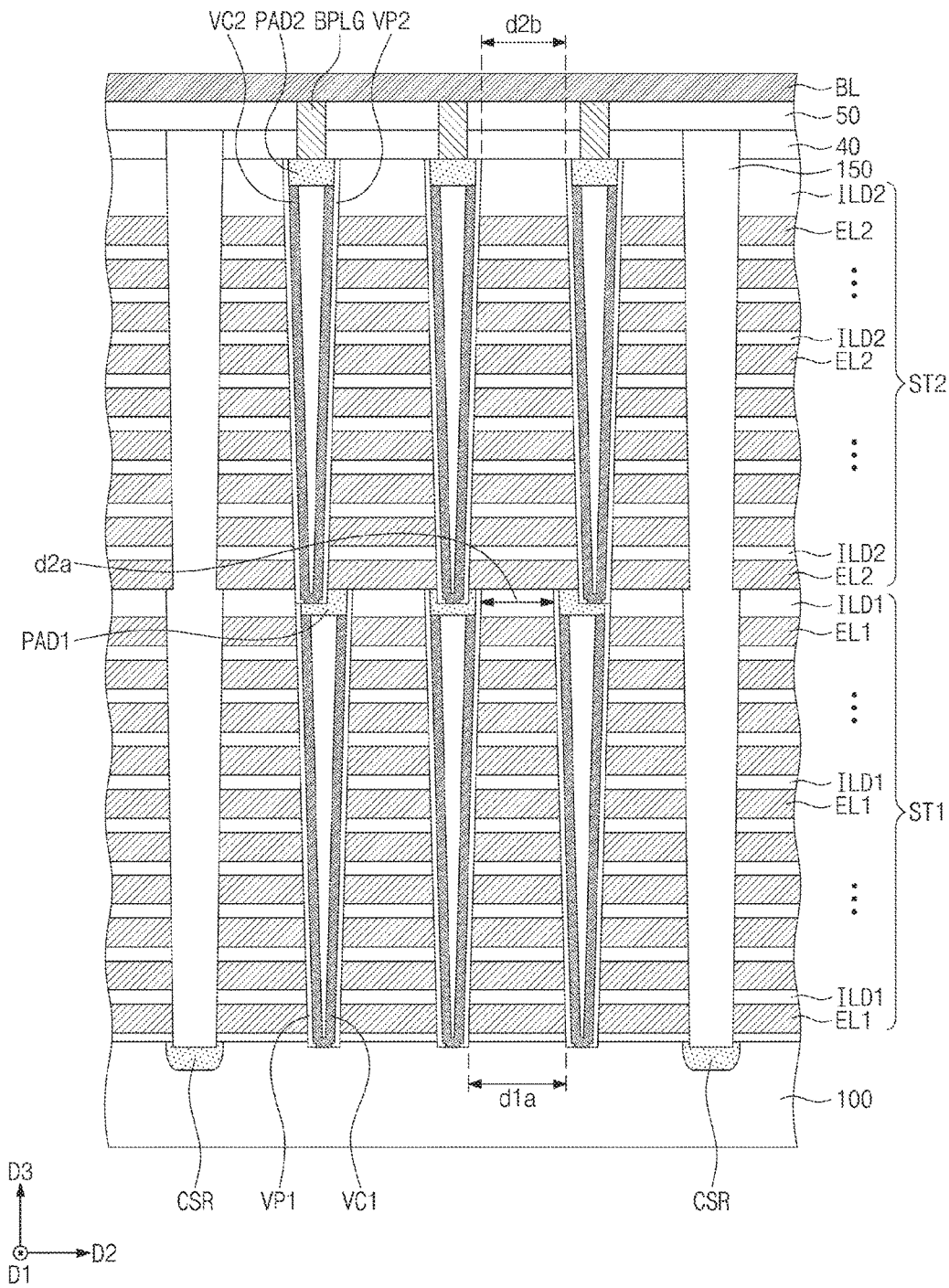

According to some embodiments, as shown in FIG. 17, the lower vertical channels VC1 may be spaced apart from each other in the second direction D2 at a first spacing, and the upper vertical channels VC2 may be spaced apart from each other in the second direction D2 at a third spacing greater than the first spacing. The second upper distance d2b between upper portions of the upper vertical channels VC2 may be greater than the first upper distance d2a between upper portions of the lower vertical channels VC1.

In some embodiments, as illustrated in FIGS. 16 and 17, the lower and upper vertical channels VC1 and VC2, which are farthest away from opposite sidewalls of the lower and upper electrode structure ST1 and ST2, may be substantially exactly or roughly aligned with each other in the third direction D3.

The lower and upper vertical channels VC1 and VC2 adjacent to one sidewall of each of the lower and upper electrode structures ST1 and ST2 may be disposed at different distances from the one sidewall of each of the lower and upper vertical channels VC1 and VC2. For example, as illustrated in FIG. 16, a distance between the one sidewall of the upper electrode structure ST2 and its outermost upper vertical channel VC2 may be less than a distance between the one sidewall of the lower electrode structure ST1 and its outermost lower vertical channel VC1. Alternatively, as illustrated in FIG. 17, the distance between the outermost upper vertical channel VC2 and the one sidewall of the upper electrode structure ST2 may be greater than the distance between the outermost lower vertical channel VC1 and the one sidewall of the lower electrode structure ST1.

Figure 18:
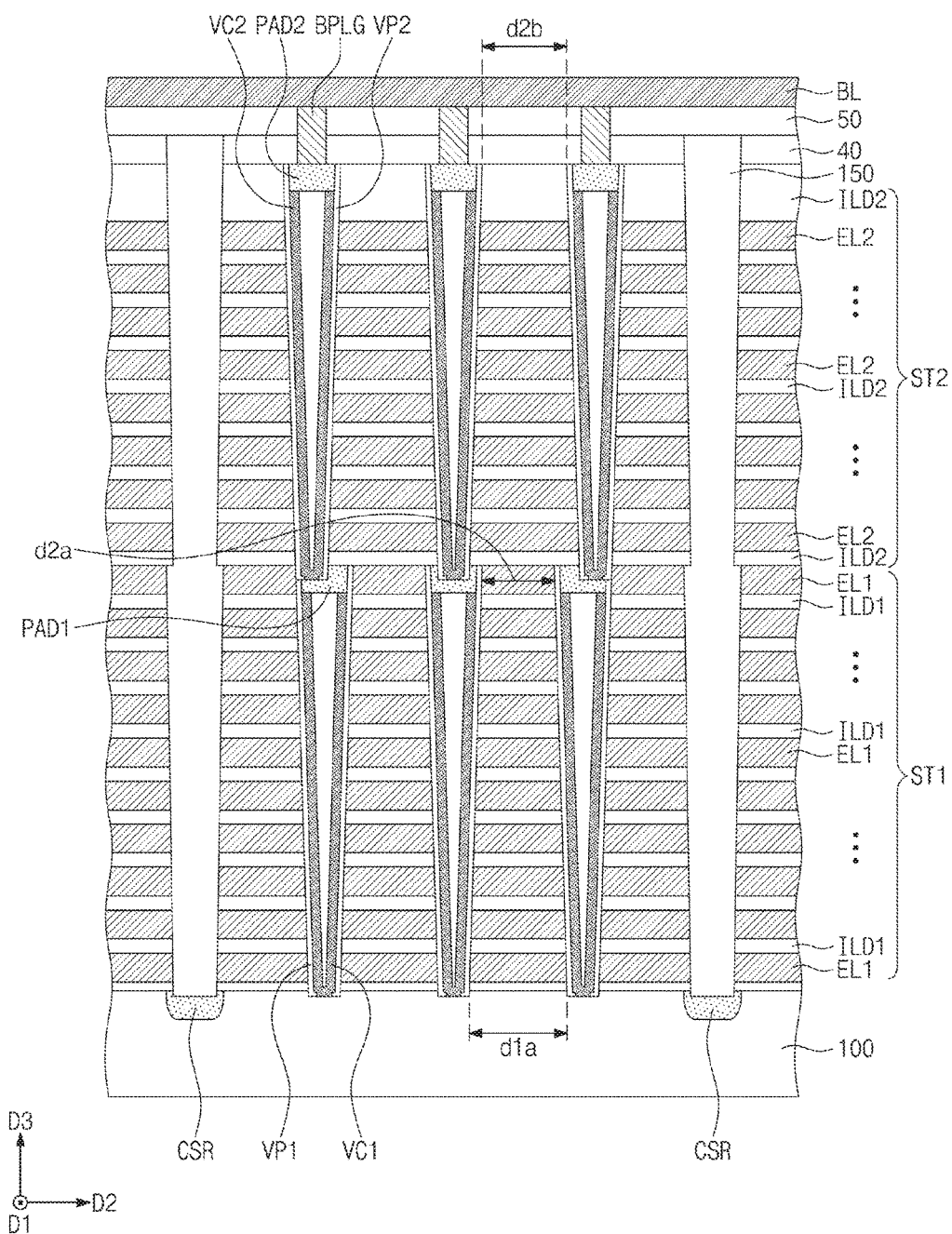

According to some embodiments, as shown in FIG. 18, the connection pads PAD1 on the lower vertical channels VC1 may be adjacent to a topmost lower electrode EL1. For example, the topmost lower electrode EL1 may surround the connection pad PAD1. A bottom surface of the connection pad PAD1 may be positioned between top and bottom surfaces of the topmost lower electrode EL1. Bottom surfaces of the upper vertical channels VC2 may be positioned below the top surface of the topmost lower electrode EL1.

Figure 19:
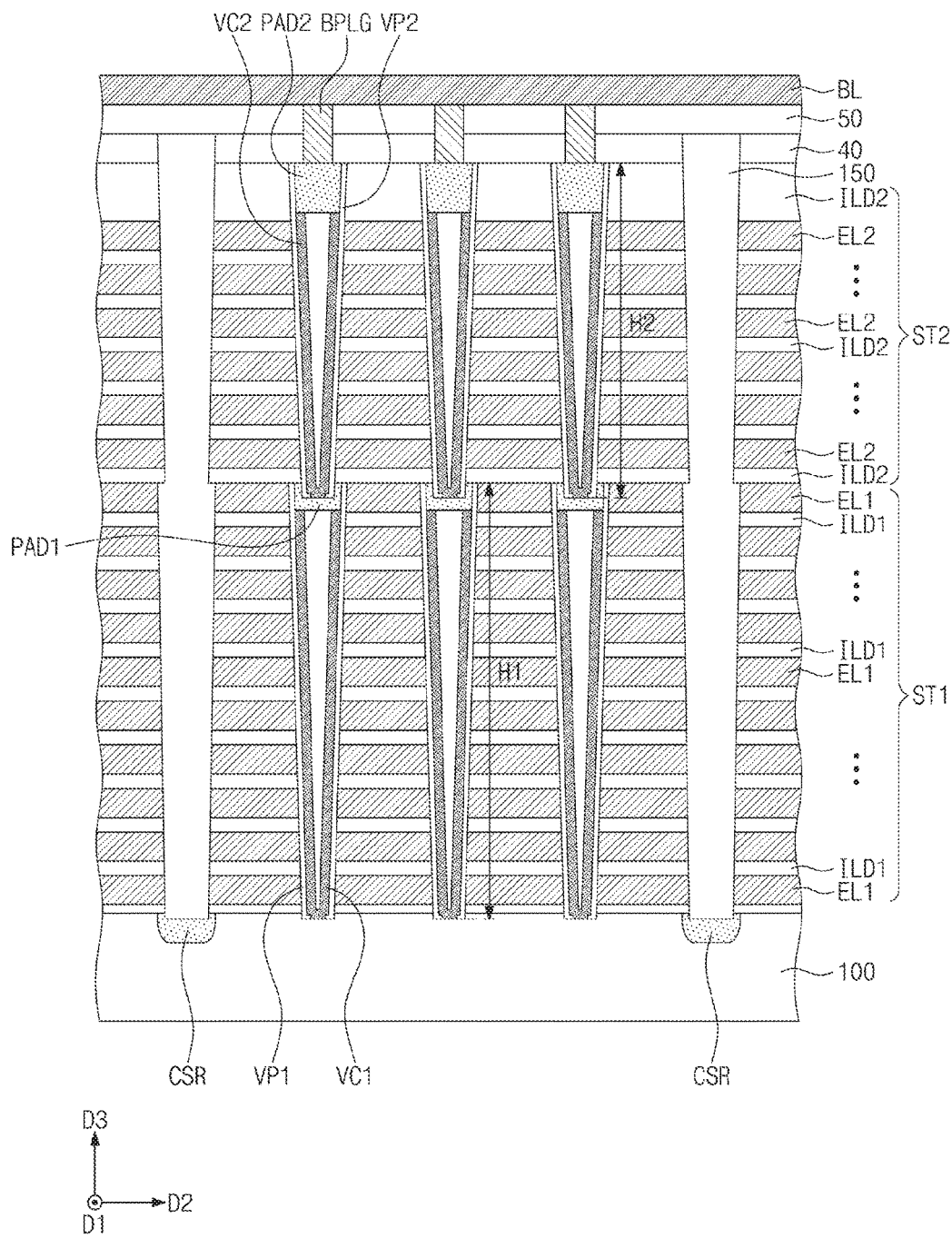

According to some embodiments, as shown in FIG. 19, the number of the lower electrodes EL1 constituting the lower electrode structure ST1 may be different from the number of the upper electrodes EL2 constituting the upper electrode structure ST2. For example, the number of the lower electrodes EL1 may be greater than the number of the upper electrodes EL2. The lower vertical channels VC1 may have a length H1 in the third direction D3 greater than a length H2 in the third direction D3 of the upper vertical channels VC2. In other embodiments, the number of the lower electrodes EL1 may be less than the number of the upper electrodes EL2.

In some embodiments, the bit line pad PAD2 may have a thickness greater than that of the connection pad PAD1. A bottom surface of the bit line pad PAD2 may be positioned between a top surface of a topmost upper electrode EL2 and a top surface of a topmost upper insulating layer ILD2.

Figure 20:
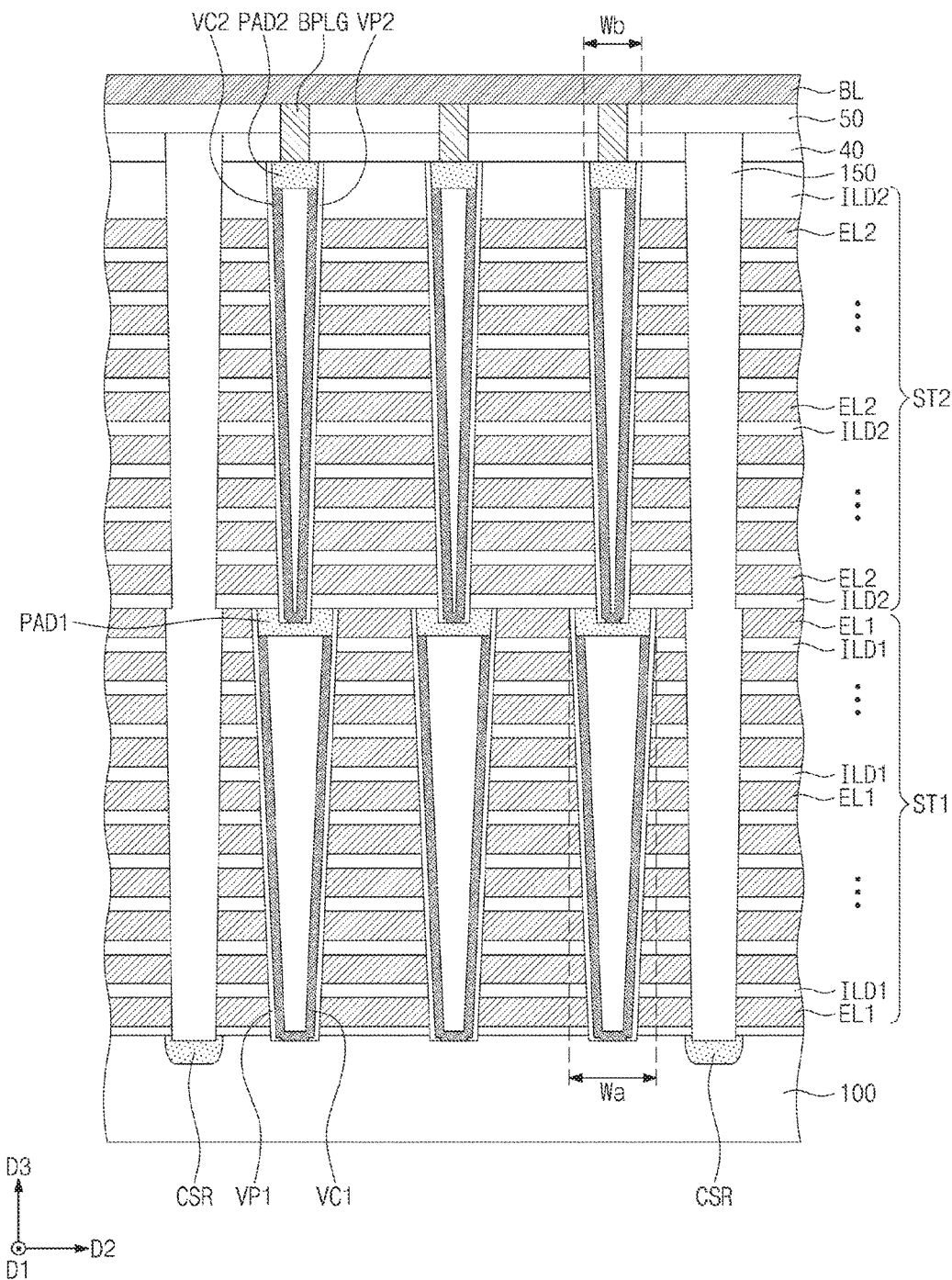

According to embodiments of FIG. 20, each of the lower and upper vertical channels VC1 and VC2 may have a lower width less than an upper width, and an upper width Wa of the lower vertical channel VC1 may be greater than an upper width Wb of the upper vertical channel VC2.

Figure 21:
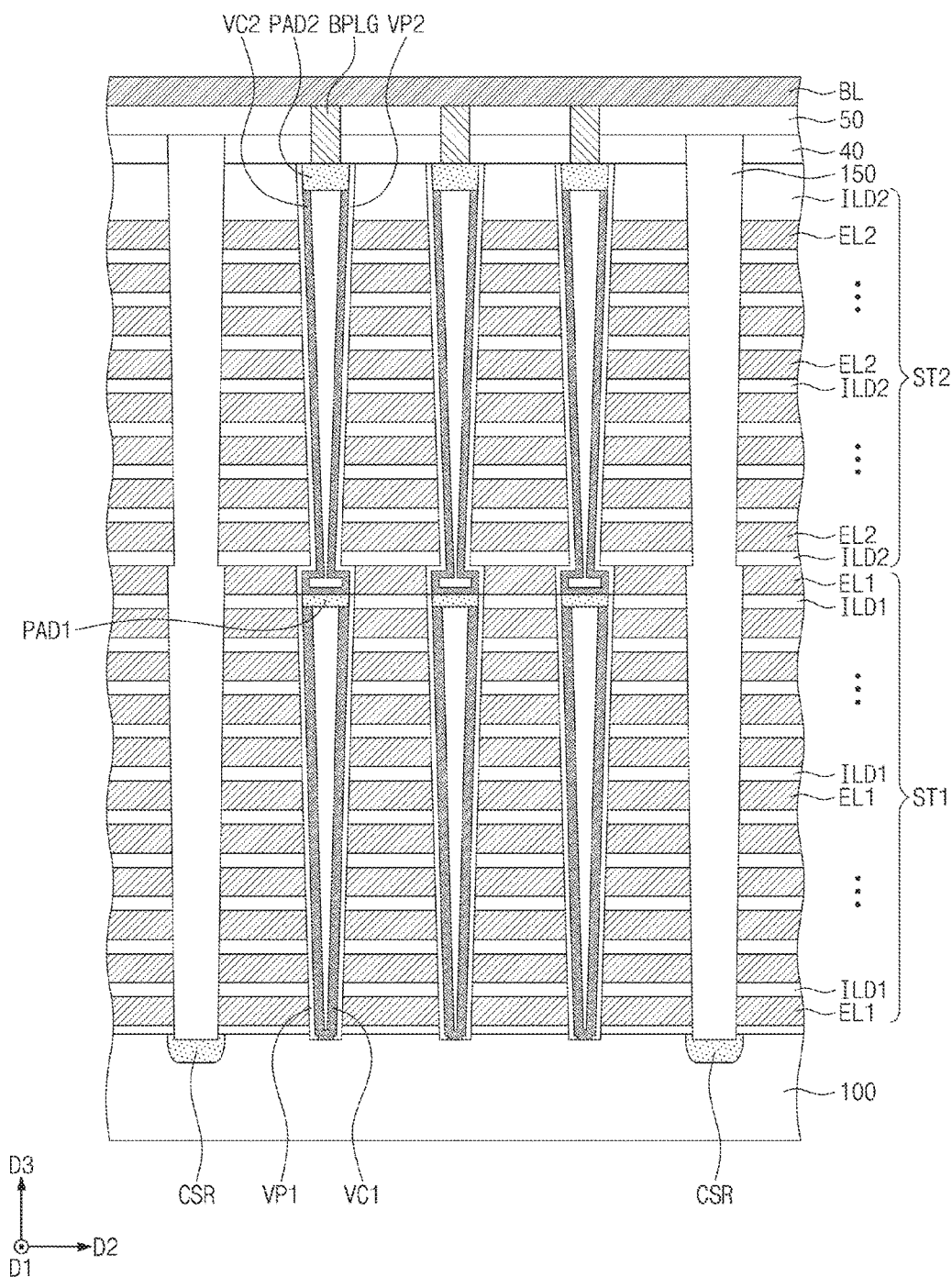

According to some embodiments, as shown in FIG. 21, each of the upper vertical channels VC2 may have an extended lower portion that is surrounded by the topmost lower electrode EL1. In this configuration, a bottom surface of the upper vertical channel VC2 may be in direct contact with an entire top surface of the bit line pad PAD2. For example, a lower width of the upper vertical channel VC2 may be substantially the same as an upper width of the lower vertical channel VC1.

Figure 22:
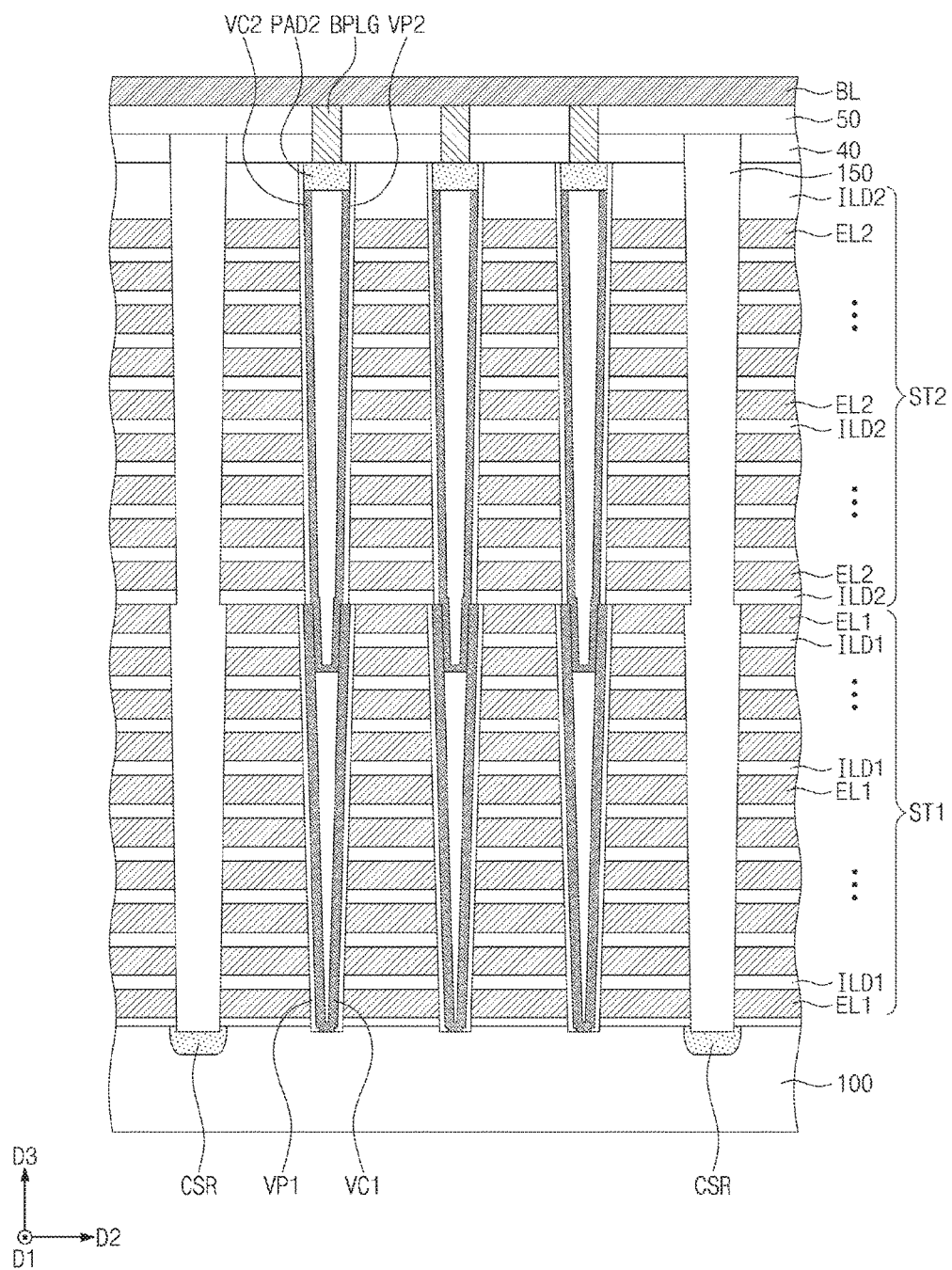

According to some embodiments, as shown in FIG. 22, the lower vertical channel VC1 may have no connection pad on its top end, and the upper vertical channel VC2 may be in direct contact with the lower vertical channel VC1. A bottom surface of the upper vertical channel VC2 may be positioned below a bottom surface of the topmost lower electrode EL1, and a lower portion of the upper vertical channel VC2 may be in direct contact with an inner sidewall of the lower vertical channel VC1.

Figure 23:
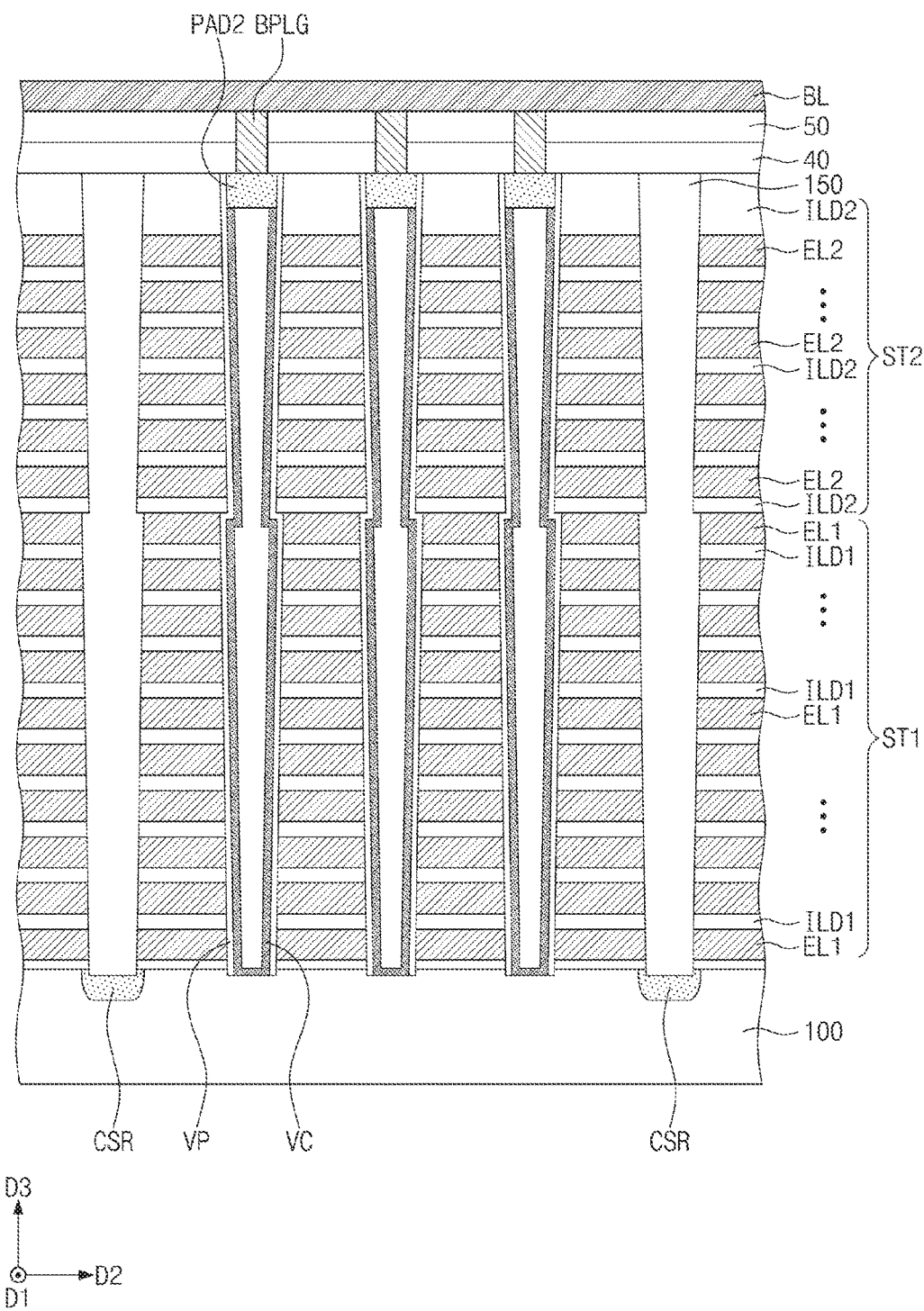

According to some embodiments, as shown in FIG. 23, each of the vertical channels VC may continuously penetrate the lower and upper electrode structures ST1 and ST2. Each of the vertical channels VC may have an inflection point at its portion adjacent to the topmost lower electrode EL1. For example, the vertical channel VC may have an inflection point at its middle portion where a width variation occurs. The vertical insulating pattern VP may surround a sidewall of the vertical channel VC and continuously penetrate the lower and upper electrode structures ST1 and ST2.

FIGS. 20 and 21 illustrate that the upper vertical channels VC2 are aligned with the lower vertical channels VC1, but as discussed above, at least one of the upper vertical channels VC2 may be misaligned with its underlying lower vertical channel VC1.

Figure 24:
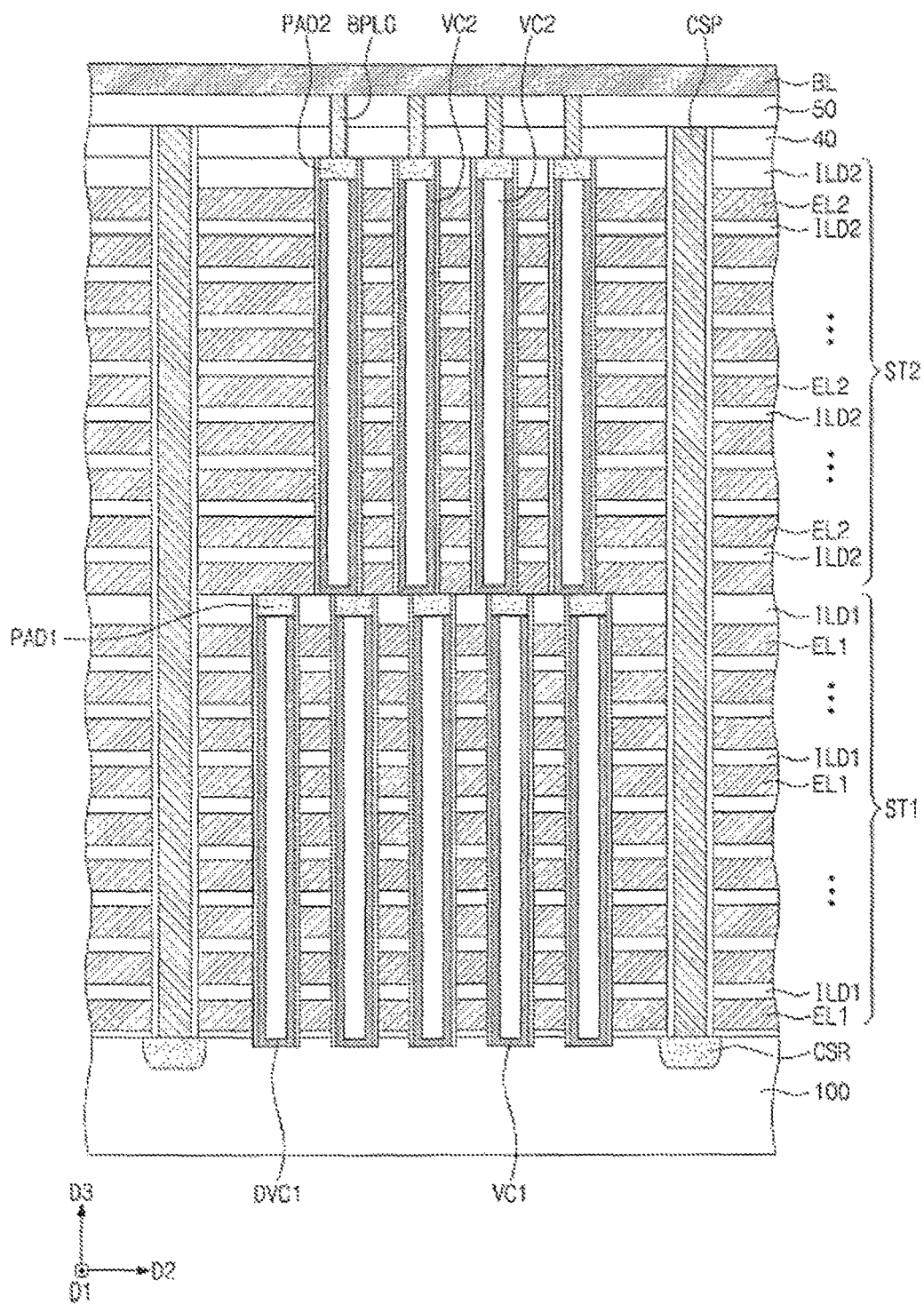

In some embodiments, as discussed with reference to FIGS. 7A and 7B through 14A and 14B, when a three-dimensional semiconductor memory devices is manufactured, the lower and upper vertical channels VC1 and VC2 may be subject to misalignment or bending. For this reason, as illustrated in FIGS. 24 and 25, on a portion of the cell array region, the number of the upper vertical channels VC2 may become different from the number of the lower vertical channels VC1.

For example, a plurality of the lower vertical channels VC1 may penetrate the lower electrode structure ST1 extending in the first direction D1, and a plurality of the upper vertical channels VC2 may penetrate the upper electrode structure ST2 extending in the first direction D1. For example, as illustrated in FIG. 24, the number of the lower vertical channels VC1 arranged along the second direction D2 may be greater than the number of the upper vertical channels VC2 arranged along the second direction D2. In this case, at least one of the lower vertical channels VC1 may be a dummy lower vertical channel DVC1 that is not electrically connected to the upper vertical channel VC2. The dummy lower vertical channel DVC1 may then be electrically floated.

Figure 25:
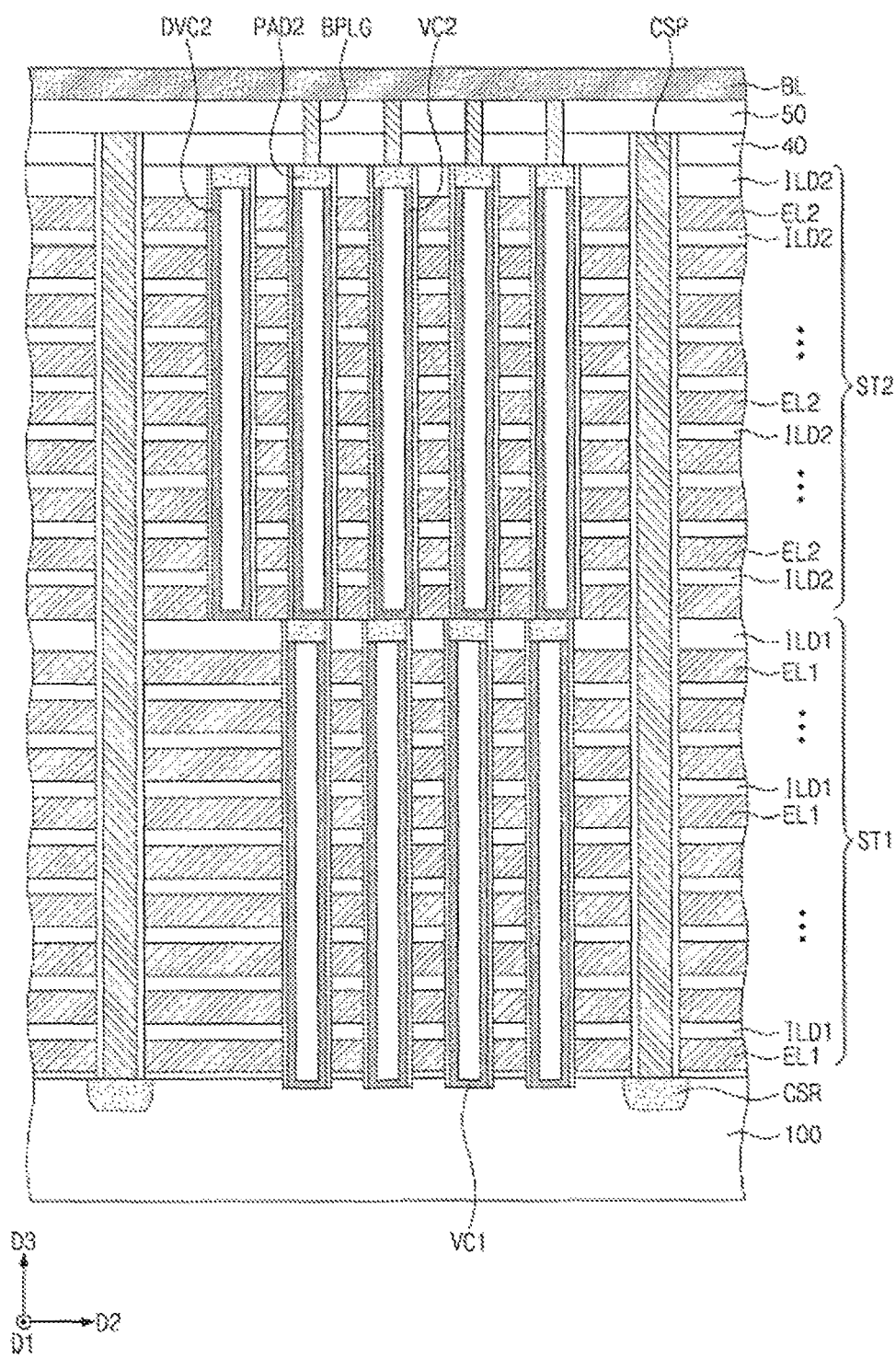

Alternatively, as illustrated in FIG. 25, the number of the lower vertical channels VC1 arranged along the second direction D2 may be less than the number of the upper vertical channels VC2 arranged along the second direction D2. In this case, at least one of the upper vertical channels VC2 may be a dummy upper vertical channel DVC2 that is not electrically connected to the lower vertical channel VC1 and thus is electrically floated.

According to some example embodiments of inventive concepts, on the central and edge portions of the cell array region, distances between the channel groups may be adjusted to improve misalignment between the upper and lower vertical channels. As a result, three-dimensional semiconductor devices may be fabricated to have superior reliability and high integration.

Although some example embodiments have been described, it will be understood to those skilled in the art that various changes and modifications may be made without departing from the technical spirit and essential features of inventive concepts. It will be apparent to those skilled in the art that various substitution, modifications, and changes may be made thereto without departing from the scope and spirit of inventive concepts.

What is claimed is:

1. A three-dimensional semiconductor memory device, comprising:
   a substrate; and
   a first channel group, a second channel group, a third channel group, and a fourth channel group each arranged in a first direction on the substrate,
   the first channel group to the fourth channel group being spaced apart from each other along a second direction on the substrate that crosses the first direction,
   each of the first channel group, the second channel group, the third channel group, and the fourth channel group including a plurality of vertical channels that extend in a third direction perpendicular to a top surface of the substrate, the first channel group and the second channel group being adjacent to each other in the second direction and spaced apart by a first distance in the second direction, the second channel group and the third channel group being adjacent to each other in the second direction and spaced apart by a second distance less than the first distance in the second direction, and the third channel group and the fourth channel group being adjacent to each other in the second direction and spaced apart by a third distance less than the second distance in the second direction.

2. The device of claim 1, further comprising:

a first electrode structure, a second electrode structure, a third electrode structure, and a fourth electrode structure that extend along the first direction and are spaced apart from each other along the second direction, wherein each of the first electrode structure, the second electrode structure, the third electrode structure, and the fourth electrode structure include a plurality of electrodes stacked on top of each other along the third direction, and the vertical channels of the first channel group, the second channel group, the third channel group, and the fourth channel group penetrate the first electrode structure, the second electrode structure, the third electrode structure, and the fourth electrode structure, respectively.

3. The device of claim 1, wherein the vertical channels include first vertical channels, second vertical channels, third vertical channels and fourth vertical channels sequentially arranged along the second direction, lower portions of the first vertical channels, the second vertical channels, the third vertical channels, and the fourth vertical channels are spaced apart from each other by a first lower distance, and upper portions of the first vertical channels and the second vertical channels are spaced apart by a first upper distance, upper portions of the second vertical channels and the third vertical channels are spaced apart by a second upper distance less than the first upper distance, and the first upper distance and the second upper distance are less than the first lower distance.

4. The device of claim 1, further comprising:

a plurality of fourth channel groups, wherein the substrate includes a first edge region, a second edge region, and a central region between the first edge region and the second edge region, the first channel group and the second channel group are provided on each of the first edge region and the second edge region, and the plurality of fourth channel groups include the fourth channel group and are on the central region, the plurality of fourth channel groups are spaced apart from each other at a fourth distance less than the second distance.

5. The device of claim 1, further comprising:

an electrode structure on the substrate, wherein the electrode structure extends along the second direction on the substrate, the electrode structure includes a plurality of electrodes stacked along the third direction, and the vertical channels of the first channel group, the second channel group, the third channel group, and the fourth channel group commonly penetrate the electrode structure.

6. The device of claim 1, further comprising:

an upper electrode structure on the substrate, wherein ; and a first upper channel group, a second upper channel group, a third upper channel group, and a fourth upper channel group respectively on the first channel group, the second channel group, the third channel group, and the fourth channel group, each of the first upper channel group to the fourth upper channel group including a plurality of upper channels that penetrate the upper electrode structure, wherein the first upper channel group and the second upper channel group are adjacent to each other in the second direction and are spaced apart at a third distance less than the first distance.

7. A three-dimensional semiconductor memory device, comprising:

a substrate;

a lower electrode structure on the substrate, the lower electrode structure including a plurality of lower electrodes that are vertically stacked on the substrate;

a plurality of lower vertical channels that penetrate the lower electrode structure;

an upper electrode structure on the lower electrode structure, the upper electrode structure including a plurality of upper electrodes that are vertically stacked on the lower electrode structure; and a plurality of upper vertical channels that penetrate the upper electrode structure and are connected to the plurality of lower vertical channels, a first distance between upper portions of the plurality of lower vertical channels that neighbor each other is different from a second distance between upper portions of the plurality of upper vertical channels that neighbor each other.

8. The device of claim 7, wherein the second distance is less than the first distance.

9. The device of claim 7, wherein a distance between lower portions of adjacent ones of the plurality of upper vertical channels is substantially the same as the first distance.

10. The device of claim 7, wherein an upper width of the plurality of lower vertical channels is greater than an upper width of the plurality of upper vertical channels.

11. The device of claim 7, wherein each of the plurality of lower vertical channels and the plurality of upper vertical channels has a lower width less than an upper width.

12. The device of claim 7, wherein each of the lower electrode structure and the upper electrode structure has a first sidewall perpendicular to the substrate, the plurality of lower vertical channels include a first lower vertical channel that is spaced apart from the first sidewall of the lower electrode structure at a first horizontal distance, and the plurality of upper vertical channels include a first upper vertical channel that is spaced apart from the first sidewall of the upper electrode structure at a second horizontal distance different from the first horizontal distance, and the first upper vertical channel is connected to the first lower vertical channel.

13. The device of claim 7, wherein a number of the plurality of lower electrodes is different from a number of the plurality of upper electrodes.

14. The device of claim 7, further comprising:
a connection pad between the plurality of lower vertical channels and the plurality of upper vertical channels, wherein
an uppermost lower electrode of the plurality of lower electrodes surrounds the connection pad.

15. A three-dimensional semiconductor memory device, comprising:
a substrate;
a first lower channel group and a second lower channel group on the substrate, the first lower channel group and the second lower channel group each including a plurality of lower vertical channels on the substrate, the first lower channel group and the second lower channel group being spaced apart at a first distance; and
a first upper channel group and a second upper channel group on the substrate at a height above a height of the first lower channel group and a height of the second lower channel group, the first upper channel group and the second upper channel group each including a plurality of upper vertical channels correspondingly connected to the lower vertical channels, the first upper channel group and the second upper channel group being spaced apart at a second distance that is less than the first distance.

16. The device of claim 15, wherein
the upper vertical channels of the first upper channel group are vertically aligned with the lower vertical channels of the first lower channel group, and
the upper vertical channels of the second upper channel group are vertically misaligned with the lower vertical channels of the second lower channel group.

17. The device of claim 15, wherein
upper portions of the lower vertical channels of the first lower channel group are spaced apart at a first upper distance, and
upper portions of the upper vertical channels of the first upper channel group are spaced apart at a second upper distance that is less than the first upper distance.

18. The device of claim 15, wherein the lower vertical channels and the upper vertical channels have substantially a same width.

19. The device of claim 15, further comprising:
a first lower electrode structure and a second lower electrode structure spaced apart from each other on the substrate; and
a first upper electrode structure and a second upper electrode structure on the first lower electrode structure and the second lower electrode structure, respectively, wherein
each of the first lower electrode structure and the second lower electrode structure includes a plurality of vertically stacked lower electrodes,
each of the first upper electrode structure and the second upper electrode structure includes a plurality of vertically stacked upper electrodes, and
the first lower electrode structure and the second lower electrode structure have substantially a same width.

* * * * *